United States Patent
Yamazaki

(10) Patent No.: US 9,219,161 B2
(45) Date of Patent: *Dec. 22, 2015

(54) SEMICONDUCTOR DEVICE

(71) Applicant: Semiconductor Energy Laboratory Co., Ltd., Atsugi-shi, Kanagawa-ken (JP)

(72) Inventor: Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 41 days.

This patent is subject to a terminal disclaimer.

(21) Appl. No.: 14/061,427

(22) Filed: Oct. 23, 2013

(65) Prior Publication Data

US 2014/0110706 A1    Apr. 24, 2014

(30) Foreign Application Priority Data

Oct. 24, 2012 (JP) ................................. 2012-234359

(51) Int. Cl.
| | |
|---|---|
| *H01L 29/10* | (2006.01) |
| *H01L 29/12* | (2006.01) |
| *H01L 29/786* | (2006.01) |
| *H01L 29/423* | (2006.01) |
| *H01L 29/66* | (2006.01) |

(52) U.S. Cl.
CPC ...... *H01L 29/7869* (2013.01); *H01L 29/42384* (2013.01); *H01L 29/66969* (2013.01); *H01L 29/78645* (2013.01); *H01L 29/78696* (2013.01)

(58) Field of Classification Search
CPC .............. H01L 29/7869; H01L 29/42384; H01L 29/66969; H01L 29/78645; H01L 29/78696
See application file for complete search history.

(56) References Cited

U.S. PATENT DOCUMENTS

| | | | |
|---|---|---|---|
| 4,353,083 A | * | 10/1982 | Trudel et al. ................. 257/326 |
| 4,466,081 A | | 8/1984 | Masuoka |
| 5,731,856 A | | 3/1998 | Kim et al. |
| 5,744,864 A | | 4/1998 | Cillessen et al. |
| 6,294,274 B1 | | 9/2001 | Kawazoe et al. |

(Continued)

FOREIGN PATENT DOCUMENTS

| | | |
|---|---|---|
| CN | 001452250 A | 10/2003 |
| CN | 101154713 A | 4/2008 |

(Continued)

OTHER PUBLICATIONS

International Search Report, PCT Application No. PCT/JP2013/078753, dated Dec. 17, 2013, 3 pages.

(Continued)

*Primary Examiner* — Victor A Mandala
(74) *Attorney, Agent, or Firm* — Fish & Richardson P.C.

(57) ABSTRACT

A semiconductor device having a structure which can prevent a decrease in electrical characteristics, which becomes more significant with miniaturization of a transistor, is provided. In addition, a highly reliable semiconductor device is provided. The semiconductor device includes a first gate electrode layer, a second gate electrode layer, and a third gate electrode layer, which are each provided separately. The first gate electrode layer overlaps with an oxide semiconductor layer. The second gate electrode layer partly covers one end portion of the oxide semiconductor layer in the channel width direction. The third gate electrode layer partly covers the other end portion of the oxide semiconductor layer in the channel width direction.

12 Claims, 21 Drawing Sheets

(56) References Cited

U.S. PATENT DOCUMENTS

| | | |
|---|---|---|
| 6,563,174 B2 | 5/2003 | Kawasaki et al. |
| 6,727,522 B1 | 4/2004 | Kawasaki et al. |
| 6,919,601 B2 * | 7/2005 | Inaba ............................ 257/347 |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,696,583 B2 | 4/2010 | Shin |
| 7,732,819 B2 | 6/2010 | Akimoto et al. |
| 7,781,760 B2 | 8/2010 | Nakamura et al. |
| 7,791,072 B2 | 9/2010 | Kumomi et al. |
| 7,884,360 B2 | 2/2011 | Takechi et al. |
| 7,892,898 B2 | 2/2011 | Oba |
| 7,994,579 B2 | 8/2011 | Itai |
| 8,148,779 B2 | 4/2012 | Jeong et al. |
| 8,203,143 B2 | 6/2012 | Imai |
| 8,237,166 B2 | 8/2012 | Kumomi et al. |
| 8,420,442 B2 | 4/2013 | Takechi et al. |
| 8,486,811 B2 * | 7/2013 | Narihiro ....................... 438/479 |
| 8,502,216 B2 | 8/2013 | Akimoto et al. |
| 8,963,148 B2 * | 2/2015 | Matsubayashi et al. ........ 257/43 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0194839 A1 | 10/2003 | Chung |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0051843 A1 | 3/2005 | Inaba |
| 2005/0199959 A1 | 9/2005 | Chiang et al. |
| 2006/0030089 A1 | 2/2006 | Chung |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0169462 A1 | 7/2008 | Nakamura et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308861 A1 * | 12/2008 | Nawaz ........................ 257/327 |
| 2009/0068773 A1 | 3/2009 | Lai et al. |
| 2009/0072233 A1 | 3/2009 | Hayashi et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0142887 A1 | 6/2009 | Son et al. |
| 2009/0152506 A1 | 6/2009 | Umeda et al. |
| 2009/0152541 A1 | 6/2009 | Maekawa et al. |
| 2009/0174012 A1 | 7/2009 | Iwasaki |
| 2009/0230478 A1 * | 9/2009 | Pillarisetty et al. ........... 257/365 |
| 2009/0278122 A1 | 11/2009 | Hosono et al. |
| 2009/0280600 A1 | 11/2009 | Hosono et al. |
| 2009/0321731 A1 | 12/2009 | Jeong et al. |
| 2010/0044864 A1 | 2/2010 | Maekawa et al. |
| 2010/0051940 A1 | 3/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0084262 A1 | 4/2011 | Kondratyuk et al. |
| 2011/0097844 A1 | 4/2011 | Takechi et al. |
| 2011/0101351 A1 | 5/2011 | Yamazaki |
| 2011/0133177 A1 | 6/2011 | Suzawa et al. |
| 2011/0147738 A1 | 6/2011 | Yamazaki et al. |
| 2011/0151618 A1 | 6/2011 | Yamazaki et al. |
| 2011/0156022 A1 | 6/2011 | Yamazaki et al. |
| 2011/0180796 A1 | 7/2011 | Yamazaki et al. |
| 2011/0181349 A1 * | 7/2011 | Yamazaki et al. ............ 327/541 |
| 2011/0193080 A1 | 8/2011 | Yamazaki et al. |
| 2011/0212569 A1 | 9/2011 | Yamazaki et al. |
| 2011/0254099 A1 * | 10/2011 | Xiao et al. .................... 257/369 |
| 2011/0260171 A1 | 10/2011 | Yamazaki |
| 2011/0263082 A1 | 10/2011 | Yamazaki |
| 2011/0263083 A1 | 10/2011 | Yamazaki |
| 2011/0263084 A1 | 10/2011 | Yamazaki |
| 2011/0263085 A1 | 10/2011 | Yamazaki |
| 2011/0263091 A1 | 10/2011 | Yamazaki |
| 2011/0284844 A1 | 11/2011 | Endo et al. |
| 2012/0132905 A1 | 5/2012 | Yamazaki |
| 2012/0175625 A1 | 7/2012 | Yamazaki |
| 2012/0211755 A1 | 8/2012 | Fujimori et al. |
| 2012/0231580 A1 | 9/2012 | Yamazaki et al. |
| 2013/0056763 A1 | 3/2013 | Koyama et al. |
| 2013/0140554 A1 | 6/2013 | Yamazaki et al. |
| 2013/0140557 A1 | 6/2013 | Miyairi et al. |
| 2013/0237012 A1 | 9/2013 | Takechi et al. |
| 2013/0285050 A1 | 10/2013 | Yamazaki et al. |
| 2014/0042437 A1 | 2/2014 | Yamazaki |
| 2014/0091303 A1 | 4/2014 | Yamazaki et al. |
| 2014/0103337 A1 | 4/2014 | Yamazaki et al. |
| 2014/0103338 A1 | 4/2014 | Yamazaki et al. |
| 2014/0103340 A1 | 4/2014 | Yamazaki et al. |
| 2014/0106504 A1 | 4/2014 | Yamazaki et al. |
| 2014/0110704 A1 | 4/2014 | Yamazaki et al. |

(56) References Cited

U.S. PATENT DOCUMENTS

| | | |
|---|---|---|
| 2014/0131700 A1 | 5/2014 | Yamazaki |
| 2014/0131702 A1 | 5/2014 | Matsubayashi et al. |
| 2014/0151674 A1 | 6/2014 | Yamazaki et al. |

FOREIGN PATENT DOCUMENTS

| | | |
|---|---|---|
| EP | 1 737 044 A1 | 12/2006 |
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-232971 A | 9/1990 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2000-315797 A | 11/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-085960 A | 3/2005 |
| JP | 2006-165528 A | 6/2006 |
| JP | 2007-096055 A | 4/2007 |
| JP | 2008-060419 A | 3/2008 |
| JP | 2008-112962 A | 5/2008 |
| JP | 2009-206306 A | 9/2009 |
| JP | 2011-082486 A | 4/2011 |
| JP | 2011-181801 A | 9/2011 |
| JP | 2011-243745 A | 12/2011 |
| KR | 2003-0081992 A | 10/2003 |
| KR | 2008-0028302 A | 3/2008 |
| KR | 2011-0039772 A | 4/2011 |
| TW | 201121055 A | 6/2011 |
| WO | 2004/114391 A1 | 12/2004 |

OTHER PUBLICATIONS

Written Opinion, PCT Application No. PCT/JP2013/078753, dated Dec. 17, 2013, 4 pages.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

(56) References Cited

OTHER PUBLICATIONS

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

(56) References Cited

OTHER PUBLICATIONS

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Song.I et al., "Short Channel Characteristics of Gallium—Indium—Zinc—Oxide Thin Film Transistors for Three-Dimensional Stacking Memory". IEEE Electron Device Letters, Jun. 1, 2008, vol. 29, No. 6, pp. 549-552.

* cited by examiner

SEMICONDUCTOR DEVICE

TECHNICAL FIELD

The present invention relates to a semiconductor device including an oxide semiconductor.

In this specification, a "semiconductor device" refers to a device that can function by utilizing semiconductor characteristics; an electro-optical device, a semiconductor circuit, and an electric device are all included in the category of the semiconductor device.

BACKGROUND ART

Attention has been focused on a technique for forming a transistor using a semiconductor thin film formed over a substrate having an insulating surface (also referred to as a thin film transistor (TFT)). The transistor is applied to a wide range of electronic devices such as an integrated circuit (IC) or an image display device (display device). A silicon-based semiconductor material is widely known as a material for a semiconductor thin film applicable to a transistor. As another example, an oxide semiconductor has been attracting attention.

For example, a transistor whose active layer includes an amorphous oxide semiconductor containing indium (In), gallium (Ga), and zinc (Zn) is disclosed in Patent Document 1.

Conventional thin film transistors mostly have what is called a planar structure, in which an active layer, an insulating film, an electrode, and the like are stacked over a plane. Owing to advances in manufacturing processes which enable miniaturization of such transistors, channel width is reduced, which causes a reduction in an on-state current. Therefore, in recent years, a transistor having a novel structure which is an alternative to the conventional planar structure has been developed. For example, Patent Document 2 discloses a fin-type transistor in which a polycrystalline silicon film is used as an active layer (referred to as a semiconductor thin film in Patent Document 2).

REFERENCE

Patent Document

[Patent Document 1] Japanese Published Patent Application No. 2006-165528
[Patent Document 2] Japanese Published Patent Application No. 2009-206306

DISCLOSURE OF INVENTION

In a transistor as disclosed in Patent Document 2, an off-state current (current flowing between a source and a drain at the time when the transistor is in an off state) can be made lower than that of a planar transistor; therefore, such a transistor is effective in reduction of power consumption. However, it is obvious that requirement for semiconductor devices with low power consumption will further increase in the future. Therefore, measures for a further reduction in off-state current of transistors are needed.

As one way to reduce an off-state current of a transistor, the use of an oxide semiconductor material for an active layer of the transistor is proposed. A transistor in which an oxide semiconductor material is used for an active layer has an extremely low off-state current compared with a transistor including a silicon-based semiconductor material.

In order to achieve high-speed operation, low power consumption, high integration, cost reduction, or the like of a transistor, it is necessary to miniaturize a transistor. However, there is a concern that miniaturization of a transistor might cause a decrease in its electrical characteristics, such as a negative shift of the threshold voltage or an increase in sub-threshold value (S value).

As measures against the above problem, the following structure is considered: an oxide semiconductor layer (an active layer) is provided between an upper gate electrode layer and a lower gate electrode layer with an insulating film provided between the oxide semiconductor layer and each of the gate electrode layers, and one gate electrode layer is used to control the operation and the other gate electrode layer is used to control the threshold voltage. However, although it is preferable that a thick oxide insulating film which supplies much oxygen to the active layer be formed between the active layer and the other gate electrode layer, there has been a problem in that the electric field from the other gate electrode layer is less likely to reach the oxide semiconductor layer.

Thus, an object of one embodiment of the present invention is to provide a semiconductor device having a structure which can prevent a decrease in electrical characteristics, which becomes more significant with miniaturization of a transistor. In addition, another object is to provide a highly reliable semiconductor device.

A semiconductor device of one embodiment of the present invention has a structure in which a plurality of gate electrode layers not only have a region overlapping with an oxide semiconductor layer with an insulating film provided therebetween but also covers an end portion of the oxide semiconductor layer in the channel width direction (i.e., a sidewall of the oxide semiconductor layer in the channel width direction). The specific structure of the semiconductor device is described below.

One embodiment of the present invention relates to a semiconductor device including a first gate electrode layer, a second gate electrode layer, and a third gate electrode layer, which are each provided separately. The first gate electrode layer overlaps with an oxide semiconductor layer. The second gate electrode layer partly covers one end portion of the oxide semiconductor layer in the channel width direction. The third gate electrode layer partly covers the other end portion of the oxide semiconductor layer in the channel width direction.

According to one embodiment of the present invention, a semiconductor device includes an oxide semiconductor layer over a substrate; a source electrode layer and a drain electrode layer in contact with the oxide semiconductor layer; a gate insulating film over the oxide semiconductor layer, and the source electrode layer and the drain electrode layer; and a first gate electrode layer, a second gate electrode layer, and a third gate electrode layer over the gate insulating film. The first gate electrode layer, the second gate electrode layer, and the third gate electrode layer are separated from one another. The first gate electrode layer overlaps with the oxide semiconductor layer. The second gate electrode layer partly covers one end portion of the oxide semiconductor layer in a channel width direction. The third gate electrode layer partly covers the other end portion of the oxide semiconductor layer in a channel width direction.

In the above structure, it is preferable that the source electrode layer include a first source electrode layer in contact with the oxide semiconductor layer and a second source electrode layer which covers the first source electrode layer and is in contact with the oxide semiconductor layer, and that the drain electrode layer include a first drain electrode layer in contact with the oxide semiconductor layer and a second drain electrode layer which covers the first drain electrode layer and is in contact with the oxide semiconductor layer.

In the above structure, it is preferable that the source electrode layer include a second source electrode layer in contact with the oxide semiconductor layer and a first source electrode layer which covers the second source electrode layer and is in contact with the oxide semiconductor layer, and that the drain electrode layer include a second drain electrode layer in contact with the oxide semiconductor layer and a first drain electrode layer which covers the second drain electrode layer and is in contact with the oxide semiconductor layer.

In the above structure, it is preferable that the oxide semiconductor layer have a structure in which a first oxide semiconductor layer, a second oxide semiconductor layer, and a third oxide semiconductor layer are stacked in this order from the substrate side, and that a bottom of a conduction band of each of the first oxide semiconductor layer and the third oxide semiconductor layer be closer to a vacuum level than a bottom of a conduction band of the second oxide semiconductor layer by 0.05 eV or more and 2 eV or less in an energy between the vacuum level and the bottom of the conduction band.

According to another embodiment of the present invention, a semiconductor device includes a first oxide semiconductor layer over a substrate; a second oxide semiconductor layer over the first oxide semiconductor layer; a first source electrode layer and a first drain electrode layer in contact with the second oxide semiconductor layer; a third oxide semiconductor layer over the second oxide semiconductor layer, and the first source electrode layer and the first drain electrode layer; a second source electrode layer which covers the first source electrode layer and is in contact with the first source electrode layer and the third oxide semiconductor layer; a second drain electrode layer which covers the first drain electrode layer and is in contact with the first drain electrode layer and the third oxide semiconductor layer; a gate insulating film over the third oxide semiconductor layer, and the second source electrode layer and the second drain electrode layer; and a first gate electrode layer, a second gate electrode layer, and a third gate electrode layer over the gate insulating film. The first gate electrode layer, the second gate electrode layer, and the third gate electrode layer are separated from one another. The first gate electrode layer overlaps with the first oxide semiconductor layer and the second oxide semiconductor layer. The second gate electrode layer partly covers one end portion of each of the first oxide semiconductor layer and the second oxide semiconductor layer in a channel width direction. The third gate electrode layer partly covers the other end portion of each of the first oxide semiconductor layer and the second oxide semiconductor layer in a channel width direction.

In the above structure, it is preferable that a bottom of a conduction band of each of the first oxide semiconductor layer and the third oxide semiconductor layer be closer to a vacuum level than a bottom of a conduction band of the second oxide semiconductor layer by 0.05 eV or more and 2 eV or less in an energy between the vacuum level and the bottom of the conduction band.

In the above structure, it is preferable that the first oxide semiconductor layer, the second oxide semiconductor layer, and the third oxide semiconductor layer be each an In-M-Zn oxide (M is Al, Ti, Ga, Y, Zr, La, Ce, Nd, or Hf), and that an atomic ratio of M to In in each of the first oxide semiconductor layer and the third oxide semiconductor layer be higher than an atomic ratio of M to In in the second oxide semiconductor layer.

In the above structure, it is preferable that the first source electrode layer and the first drain electrode layer be each Al, Cr, Cu, Ta, Ti, Mo, W, or an alloy material containing any of Al, Cr, Cu, Ta, Ti, Mo, and W as its main component.

In the above structure, it is preferable that the second source electrode layer and the second drain electrode layer be tantalum nitride, titanium nitride, ruthenium, or an alloy material containing any of tantalum nitride, titanium nitride, and ruthenium as its main component.

In the above structure, it is preferable that the first gate electrode layer be in a position overlapping with neither the first source electrode layer nor the first drain electrode layer.

With the use of one embodiment of the present invention, it is possible to provide a semiconductor device in which a decrease in electrical characteristics, such as a negative shift of the threshold voltage or an increase in subthreshold value (S value) due to miniaturization of a transistor, can be suppressed. Further, it is possible to provide a highly reliable semiconductor device.

BEST MODE FOR CARRYING OUT THE INVENTION

Figure 1A:
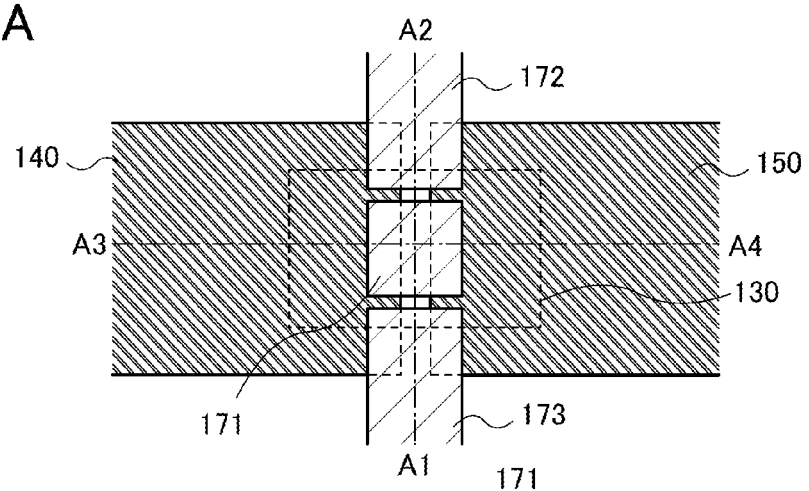
FIGS. 1A to 1C are a top view and cross-sectional views which illustrate a transistor.

Embodiments are described in detail with reference to the drawings. Note that the present invention is not limited to the following description and it will be readily appreciated by those skilled in the art that modes and details can be modified in various ways without departing from the spirit and the scope of the present invention. Therefore, the present invention should not be limited to the descriptions of the embodiments below. Note that in structures of the present invention described below, the same portions or portions having similar functions are denoted by the same reference numerals in different drawings, and description thereof is omitted in some cases.

Embodiment 1

In this embodiment, a semiconductor device of one embodiment of the present invention will be described with reference to drawings.

Figure 1B:
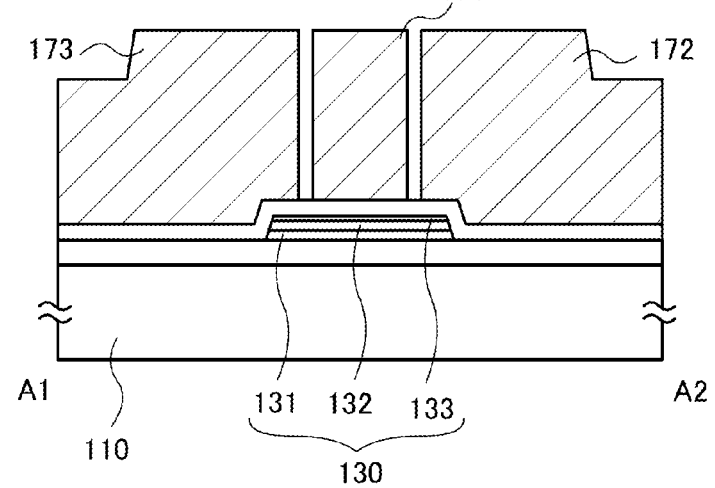
Figure 1C:
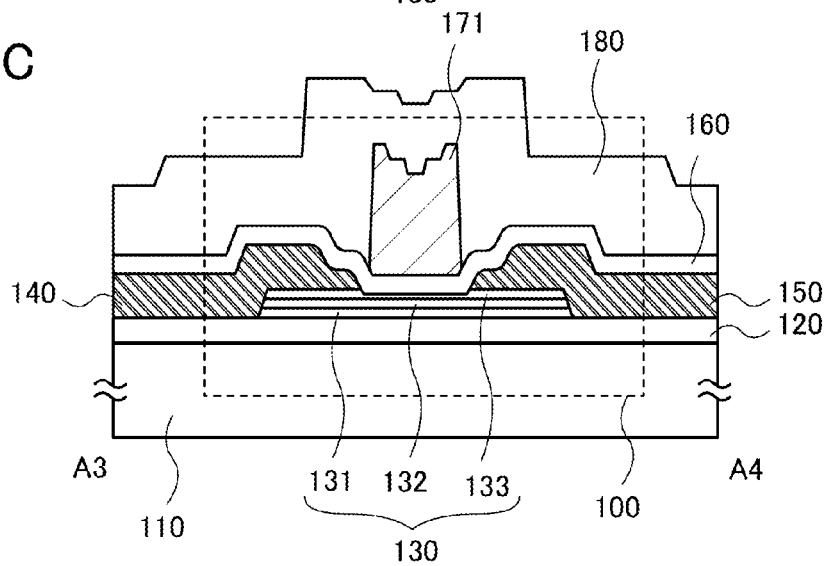

FIGS. 1A, 1B, and 1C are a top view and cross-sectional views which illustrate a transistor of one embodiment of the present invention. FIG. 1A is the top view, and a cross section taken along a dashed-dotted line A1-A2 in FIG. 1A is illustrated in FIG. 1B. A cross section taken along a dashed-dotted line A3-A4 in FIG. 1A is illustrated in FIG. 1C. Note that for simplification of the drawing, some components in the top view in FIG. 1A are not illustrated. In some cases, the direction of the dashed-dotted line A1-A2 is referred to as a channel width direction, and the direction of the dashed-dotted line A3-A4 is referred to as a channel length direction.

A transistor 100 illustrated in FIGS. 1A, 1B, and 1C includes a base insulating film 120 formed over a substrate 110; an oxide semiconductor layer 130 formed over the base insulating film 120; a source electrode layer 140 and a drain electrode layer 150 formed over the oxide semiconductor layer 130; a gate insulating film 160 formed over the source electrode layer 140, the drain electrode layer 150, and the oxide semiconductor layer 130; and a first gate electrode layer 171, a second gate electrode layer 172, and a third gate electrode layer 173 formed over the gate insulating film 160. Further, an oxide insulating layer 180 may be formed over the gate insulating film 160, and the first gate electrode layer 171, the second gate electrode layer 172, and the third gate electrode layer 173. Note that the oxide insulating layer 180 may be provided as needed and another insulating layer may be further provided thereover.

Note that functions of a "source" and a "drain" of a transistor are sometimes replaced with each other when a transistor of opposite polarity is used or when the direction of current flowing is changed in circuit operation, for example. Thus, the terms "source" and "drain" can be used to denote the drain and the source, respectively, in this specification.

The substrate 110 is not limited to a simple supporting substrate, and may be a substrate where another device such as a transistor is formed. In that case, at least one of the first gate electrode layer 171, the second gate electrode layer 172, the third gate electrode layer 173, the source electrode layer 140, and the drain electrode layer 150 of the transistor 100 may be electrically connected to the above device.

The base insulating film 120 can have a function of supplying oxygen to the oxide semiconductor layer 130 as well as a function of preventing diffusion of an impurity from the substrate 110; thus, the base insulating film 120 is preferably an insulating film containing oxygen, further preferably an insulating film containing excess oxygen. Note that in the case where the substrate 110 is a substrate where another device is formed as described above, the base insulating film 120 also has a function as an interlayer insulating film. In that case, the base insulating film 120 is preferably subjected to planarization treatment such as chemical mechanical polishing (CMP) treatment so as to have a flat surface.

The oxide semiconductor layer 130 has a structure in which a first oxide semiconductor layer 131, a second oxide semiconductor layer 132, and a third oxide semiconductor layer 133 are stacked in that order from the substrate 110 side. Here, for the second oxide semiconductor layer 132, an oxide semiconductor whose electron affinity (a difference in energy between a vacuum level and a bottom of a conduction band) is higher than those of the first oxide semiconductor layer 131 and the third oxide semiconductor layer 133 is used. The electron affinity can be obtained by subtracting an energy difference between a bottom of a conduction band and a top of a valence band (what is called a band gap) from an energy difference between the vacuum level and the top of the valence band (what is called an ionization potential).

Although the case where the oxide semiconductor layer 130 is a stack of three layers is described in this embodiment, the oxide semiconductor layer 130 may be a single layer or a stack of two layers or four or more layers. In the case of a single layer, a layer corresponding to the second oxide semiconductor layer 132 is used. In the case of two layers, a layer corresponding to the second oxide semiconductor layer 132 is formed on the substrate 110 side and a layer corresponding to the first oxide semiconductor layer 131 or the third oxide semiconductor layer 133 is formed on the gate insulating film 160 side. In the case of four or more layers, the second oxide semiconductor layer 132 is provided between layers each corresponding to the first oxide semiconductor layer 131 or the third oxide semiconductor layer 133 as described in this embodiment.

The first oxide semiconductor layer 131 and the third oxide semiconductor layer 133 each contain one or more metal elements included in the second oxide semiconductor layer 132 and are each preferably formed using an oxide semiconductor whose bottom of the conduction band is closer to a vacuum level than that of the second oxide semiconductor layer 132 by 0.05 eV or more, 0.07 eV or more, 0.1 eV or more, or 0.15 eV or more and 2 eV or less, 1 eV or less, 0.5 eV or less, or 0.4 eV or less in an energy between the vacuum level and the bottom of the conduction band.

In such a structure, when an electric field is applied to the first gate electrode layer 171, a channel is formed in the second oxide semiconductor layer 132 of the oxide semiconductor layer 130, whose energy at the bottom of the conduction band is the lowest. In other words, the third oxide semiconductor layer 133 is formed between the second oxide semiconductor layer 132 and the gate insulating film 160, whereby a structure in which the channel of the transistor is not in contact with the gate insulating film 160 can be obtained.

Further, since the first oxide semiconductor layer 131 includes one or more metal elements included in the second oxide semiconductor layer 132, an interface state is less likely to be formed at the interface between the second oxide semiconductor layer 132 and the first oxide semiconductor layer 131. The interface state sometimes forms a channel; therefore, a second transistor which has a different threshold voltage is formed and accordingly the apparent threshold voltage of the transistor is changed in some cases. Thus, with the first oxide semiconductor layer 131, fluctuation in electrical characteristics of the transistors, such as a threshold voltage, can be reduced.

Furthermore, since the third oxide semiconductor layer 133 includes one or more metal elements included in the second oxide semiconductor layer 132, scattering of carriers is less likely to occur at the interface between the second oxide semiconductor layer 132 and the third oxide semiconductor layer 133. Therefore, with the third oxide semiconductor layer 133, the field-effect mobility of the transistor can be increased.

For the first oxide semiconductor layer 131 and the third oxide semiconductor layer 133, for example, a material containing much Al, Ti, Ga, Ge, Y, Zr, Sn, La, Ce, or Hf in an atomic ratio than a material of the second oxide semiconductor layer 132 can be used. Specifically, any of the above metal elements in an atomic ratio 1.5 times or more, preferably 2 times or more, further preferably 3 times or more as much as a metal element of the second oxide semiconductor layer 132 is contained. Any of the above metal elements is strongly bonded to oxygen and thus has a function of suppressing generation of an oxygen vacancy in the first oxide semiconductor layer 131 and the third oxide semiconductor layer 133. That is, an oxygen vacancy is less likely to be generated in the first oxide semiconductor layer 131 and the third oxide semiconductor layer 133 than in the second oxide semiconductor layer 132.

Note that when each of the first oxide semiconductor layer 131, the second oxide semiconductor layer 132, and the third oxide semiconductor layer 133 is an In-M-Zn oxide containing at least indium, zinc, and M (M is a metal such as Al, Ti, Ga, Ge, Y, Zr, Sn, La, Ce, or Hf), and the first oxide semiconductor layer 131 has an atomic ratio of In to M and Zn which is $x_1:y_1:z_1$, the second oxide semiconductor layer 132 has an atomic ratio of In to M and Zn which is $x_2:y_2:z_2$, and the third oxide semiconductor layer 133 has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, further preferably 3 times or more as large as $y_2/x_2$. At this time, when $y_2$ is greater than or equal to $x_2$ in the second oxide semiconductor layer 132, a transistor can have stable electrical characteristics. However, when $y_2$ is 3 times or more as great as $x_2$, the field-effect mobility of the transistor is reduced; accordingly, $y_2$ is preferably less than 3 times $x_2$.

Further, it is preferable that, in the atomic ratio between In and M in each of the first oxide semiconductor layer 131 and the third oxide semiconductor layer 133, the proportion of In be less than 50 atomic % and the proportion of M be greater than or equal to 50 atomic %, and it is further preferable that, in the atomic ratio between In and M, the proportion of In be less than 25 atomic % and the proportion of M be greater than or equal to 75 atomic %. It is preferable that, in the atomic ratio between In and M in the second oxide semiconductor layer 132, the proportion of In be greater than or equal to 25 atomic % and the proportion of M be less than 75 atomic %, and it is further preferable that, in the atomic ratio between In and M, the proportion of In be greater than or equal to 34 atomic % and the proportion of M be less than 66 atomic %.

The thicknesses of the first oxide semiconductor layer 131 and the third oxide semiconductor layer 133 are each greater than or equal to 3 nm and less than or equal to 100 nm, preferably greater than or equal to 3 nm and less than or equal to 50 nm. The thickness of the second oxide semiconductor layer 132 is greater than or equal to 3 nm and less than or equal to 200 nm, preferably greater than or equal to 3 nm and less than or equal to 100 nm, further preferably greater than or equal to 3 nm and less than or equal to 50 nm.

For the first oxide semiconductor layer 131, the second oxide semiconductor layer 132, and the third oxide semiconductor layer 133, an oxide semiconductor containing indium, zinc, and gallium can be used, for example. Note that the second oxide semiconductor layer 132 preferably contains indium because carrier mobility can be increased.

Note that stable electrical characteristics can be effectively imparted to a transistor in which an oxide semiconductor layer serves as a channel by reducing the concentration of impurities in the oxide semiconductor layer to make the oxide semiconductor layer intrinsic or substantially intrinsic. The term "substantially intrinsic" refers to the state where an oxide semiconductor layer has a carrier density lower than $1\times10^{17}/cm^3$, preferably lower than $1\times10^{15}/cm^3$, further preferably lower than $1\times10^{13}/cm^3$.

Further, in the oxide semiconductor layer, hydrogen, nitrogen, carbon, silicon, and metal elements except for those of main components are impurities. For example, hydrogen and nitrogen form donor levels to increase the carrier density. Silicon forms impurity levels in an oxide semiconductor layer. The impurity levels serve as traps and might cause electrical characteristics of the transistor to deteriorate. Therefore, it is effective to reduce the concentration of the impurities in the first oxide semiconductor layer 131, the second oxide semiconductor layer 132, and the third oxide semiconductor layer 133 and at interfaces between the layers.

The oxide semiconductor layer can be intrinsic or substantially intrinsic under the following conditions: in secondary ion mass spectrometry (SIMS) analysis, the concentration of silicon is lower than $1\times10^{19}$ atoms/$cm^3$, preferably lower than $5\times10^{18}$ atoms/$cm^3$, further preferably lower than $1\times10^{18}$ atoms/$cm^3$; the concentration of hydrogen is lower than or equal to $2\times10^{20}$ atoms/$cm^3$, preferably lower than or equal to $5\times10^{19}$ atoms/$cm^3$, further preferably lower than or equal to $1\times10^{19}$ atoms/$cm^3$, still further preferably lower than or equal to $5\times10^{18}$ atoms/$cm^3$; and the concentration of nitrogen is lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

In the case where the oxide semiconductor layer includes crystals, high concentration of silicon or carbon might reduce the crystallinity of the oxide semiconductor layer. The crystallinity of the oxide semiconductor layer can be prevented from decreasing when the concentration of silicon is lower than $1\times10^{19}$ atoms/$cm^3$, preferably lower than $5\times10^{18}$ atoms/$cm^3$, further preferably lower than $1\times10^{18}$ atoms/$cm^3$, and the concentration of carbon is lower than $1\times10^{19}$ atoms/$cm^3$, preferably lower than $5\times10^{18}$ atoms/$cm^3$, further preferably lower than $1\times10^{18}$ atoms/$cm^3$.

A transistor in which a highly purified oxide semiconductor film is used for a channel formation region as described above has an extremely low off-state current, and the off-state current standardized on the channel width of the transistor can be as low as several yoktoamperes per micrometer to several zeptoamperes per micrometer.

Note that as the gate insulating film of the transistor, an insulating film containing silicon is used in many cases; therefore, it is preferable that a region of the oxide semiconductor layer, which serves as a channel, be not in contact with the gate insulating film for the above-described reason. In the case where a channel is formed at the interface between a gate insulating film and an oxide semiconductor layer, scattering of carriers occurs at the interface, whereby the field-effect mobility of a transistor is reduced in some cases. Also from the view of the above, it is preferable that a region of the oxide semiconductor layer, which serves as a channel, be separated from the gate insulating film.

Therefore, with the oxide semiconductor layer 130 having a stacked-layer structure including the first oxide semiconductor layer 131, the second oxide semiconductor layer 132, and the third oxide semiconductor layer 133, the second oxide semiconductor layer 132 where a channel of the transistor is formed can be separated from the gate insulating film; accordingly, the transistor can have a high field-effect mobility and stable electrical characteristics.

Next, the band structure of the oxide semiconductor layer 130 will be described. A stack corresponding to the oxide semiconductor layer 130 in which an In—Ga—Zn oxide having an energy gap of 3.15 eV is used as a layer corresponding to each of the first oxide semiconductor layer 131 and the third oxide semiconductor layer 133 and an In—Ga—Zn oxide having an energy gap of 2.8 eV is used as a layer corresponding to the second oxide semiconductor layer 132 is fabricated, and the band structure thereof is analyzed. Note that for convenience, the stack is referred to as an oxide semiconductor layer 130, and the layers forming the stack are referred to as a first oxide semiconductor layer 131, a second oxide semiconductor layer 132, and a third oxide semiconductor layer 133.

The thickness of each of the first oxide semiconductor layer 131, the second oxide semiconductor layer 132, and the third oxide semiconductor layer 133 was 10 nm. The energy gap was measured with the use of a spectroscopic ellipsometer (UT-300 manufactured by HORIBA Jobin Yvon). Further, the energy gap in the vicinity of the interface between the first oxide semiconductor layer 131 and the second oxide semiconductor layer 132 and the energy gap in the vicinity of the interface between the third oxide semiconductor layer 133 and the second oxide semiconductor layer 132 were each 3 eV.

Figure 2A:
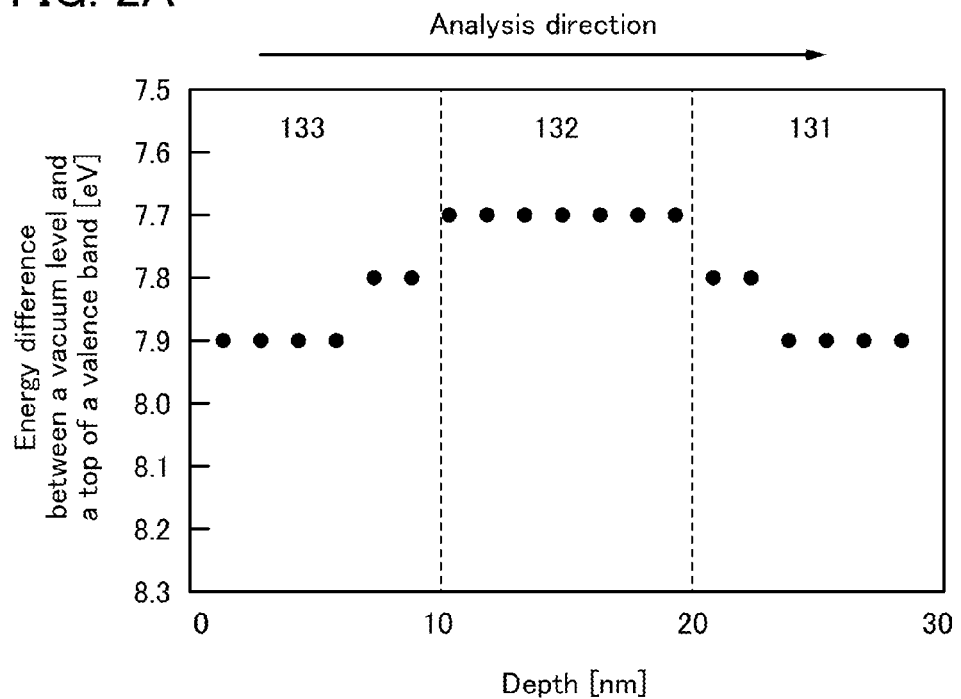
FIGS. 2A and 2B each illustrate a band structure of oxide semiconductor layers.

In FIG. 2A, the energy difference between a vacuum level and a top of a valence band of each layer was measured while the oxide semiconductor layer 130 was etched from the third oxide semiconductor layer 133 side, and was plotted. The energy difference between the vacuum level and the top of the valence band was measured using an ultraviolet photoelectron spectroscopy (UPS) device (VersaProbe manufactured by ULVAC-PHI, Inc.).

Figure 2B:
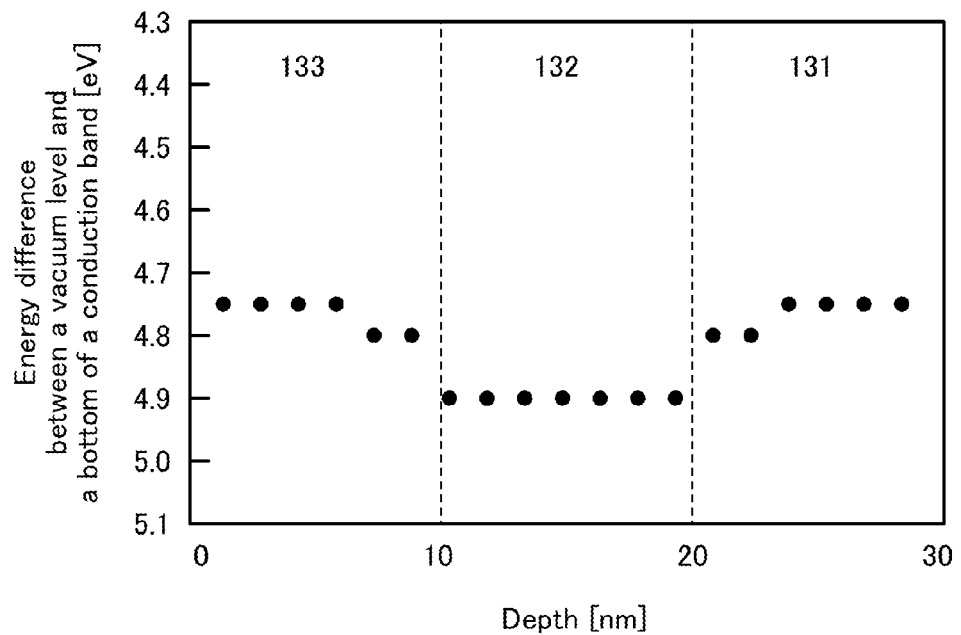

In FIG. 2B, an energy difference (electron affinity) between the vacuum level and a bottom of a conduction band of each layer, which was calculated by subtracting the energy gap of each layer from the energy difference between the vacuum level and the top of the valence band, was plotted.

Figure 3A:
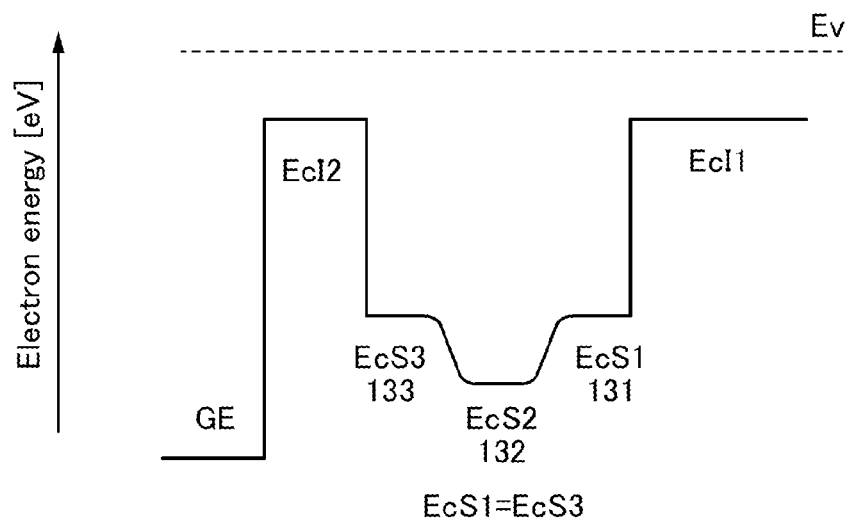
FIGS. 3A and 3B each illustrate a band structure of oxide semiconductor layers.

Part of the band structure in FIG. 2B is schematically shown in FIG. 3A. FIG. 3A shows the case where silicon oxide films are provided in contact with the first oxide semiconductor layer 131 and the third oxide semiconductor layer 133. Here, Ev represents energy of the vacuum level, EcI1 and EcI2 represent energy at the bottom of the conduction band of the silicon oxide film, EcS1 represents energy at the bottom of the conduction band of the first oxide semiconductor layer 131, EcS2 represents energy at the bottom of the conduction band of the second oxide semiconductor layer 132, and EcS3 represents energy at the bottom of the conduction band of the third oxide semiconductor layer 133. Further, in forming a transistor, a gate electrode layer (the first gate electrode layer 171 in the transistor 100) is to be in contact with a silicon oxide film having EcI2.

As shown in FIG. 3A, the energies of the bottoms of the conduction bands of the first oxide semiconductor layer 131, the second oxide semiconductor layer 132, and the third oxide semiconductor layer 133 are changed continuously. This can be understood also from the fact that the compositions of the first oxide semiconductor layer 131, the second oxide semiconductor layer 132, and the third oxide semiconductor layer 133 are close to one another and oxygen is easily diffused among the first oxide semiconductor layer 131, the second oxide semiconductor layer 132, and the third oxide semiconductor layer 133.

The oxide semiconductor layer 130 in which layers containing the same main components are stacked is formed to have not only a simple stacked-layer structure of the layers but also a continuous energy band (here, in particular, a well structure having a U shape in which energies of the bottoms of the conduction bands are changed continuously between layers). In other words, the stacked-layer structure is formed so that a defect state which serves as a trap canter or a recombination center in an oxide semiconductor, or an impurity which forms a barrier preventing the flow of carriers does not exist at interfaces between the layers. If impurities are mixed between the stacked oxide semiconductor layers, the continuity of the energy band is lost and carriers disappear by a trap or recombination.

In order to form continuous junction, the layers need to be stacked successively without being exposed to the air by using a multi-chamber deposition system (sputtering apparatus) provided with a load lock chamber. It is preferable that each chamber of the sputtering apparatus be able to be evacuated to a high vacuum (to about $1\times10^{-4}$ Pa to $5\times10^{-7}$ Pa) by an adsorption vacuum pump such as a cryopump and that the chamber be able to heat a substrate over which a film is to be deposited to 100° C. or higher so that water and the like acting as impurities of the oxide semiconductor are removed as much as possible. Alternatively, a combination of a turbo molecular pump and a cold trap is preferably used to prevent back-flow of a gas containing a carbon component, moisture, or the like from an exhaust system into the chamber.

Not only high vacuum evaporation of the chamber but also high purity of a sputtering gas is necessary to obtain a highly purified intrinsic oxide semiconductor. As an oxygen gas or an argon gas used as the sputtering gas, a gas that is highly purified to have a dew point of −40° C. or lower, preferably −80° C. or lower, further preferably −100° C. or lower is used, so that entry of moisture or the like into the oxide semiconductor film can be prevented as much as possible.

Figure 3B:
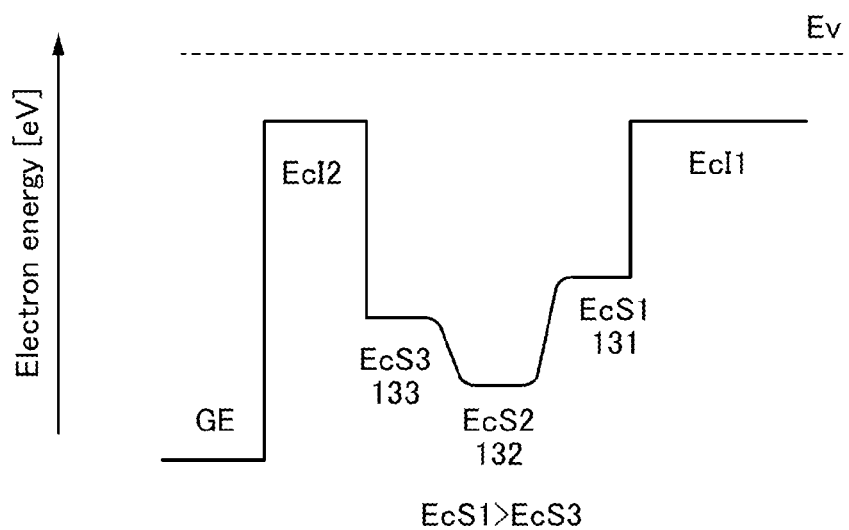

Note that FIG. 3A shows the case where EcS1 and EcS3 are similar to each other; however, EcS1 and EcS3 may be different from each other. For example, part of the band structure in the case where EcS1 is higher than EcS3 is shown as in FIG. 3B.

For example, when EcS1 is equal to EcS3, an In—Ga—Zn oxide whose atomic ratio of In to Ga and Zn is 1:3:2 can be used for the first oxide semiconductor layer 131 and the third oxide semiconductor layer 133 and an In—Ga—Zn oxide whose atomic ratio of In to Ga and Zn is 1:1:1 can be used for the second oxide semiconductor layer 132. Further, when EcS1 is higher than EcS3, an In—Ga—Zn oxide whose atomic ratio of In to Ga and Zn is 1:6:4 or 1:9:6 can be used for the first oxide semiconductor layer 131, an In—Ga—Zn oxide whose atomic ratio of In to Ga and Zn is 1:1:1 or 3:1:2 can be used for the second oxide semiconductor layer 132, and an In—Ga—Zn oxide whose atomic ratio of In to Ga and Zn is 1:3:2 can be used for the third oxide semiconductor layer 133, for example.

According to FIGS. 2A and 2B and FIGS. 3A and 3B, the second oxide semiconductor layer 132 of the oxide semiconductor layer 130 serves as a well, so that a channel is formed in the second oxide semiconductor layer 132 in a transistor including the oxide semiconductor layer 130. Note that since the energies of the bottoms of the conduction bands are changed continuously, the oxide semiconductor layer 130 can also be referred to as a U-shaped well. Further, a channel formed to have such a structure can also be referred to as a buried channel.

Figure 4:
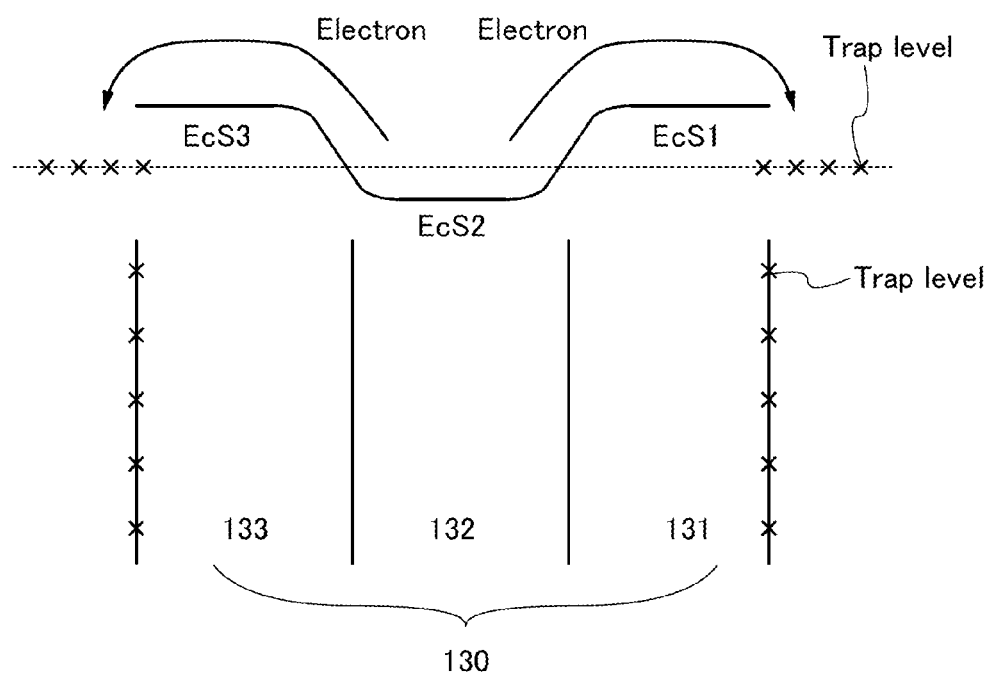
FIG. 4 illustrates a band structure of oxide semiconductor layers.

Note that trap levels due to impurities or defects might be formed in the vicinity of the interface between an insulating film such as a silicon oxide film and each of the first oxide semiconductor layer 131 and the third oxide semiconductor layer 133 as shown in FIG. 4. The second oxide semiconductor layer 132 can be distanced away from the trap levels owing to existence of the first oxide semiconductor layer 131 and the third oxide semiconductor layer 133. However, when the energy difference between EcS1 and EcS2 and the energy difference between EcS3 and EcS2 is small, an electron in the second oxide semiconductor layer 132 might reach the trap level by passing over the energy difference. By being trapped in the trap level, a negative fixed charge is caused at the interface with the insulating film, whereby the threshold voltage of the transistor is shifted in the positive direction.

Thus, the energy difference between EcS1 and EcS2 and the energy difference between EcS3 and EcS2 are each preferably greater than or equal to 0.1 eV, further preferably greater than or equal to 0.15 eV, so that the amount of change of the threshold voltage of the transistor is reduced and stable electrical characteristics can be obtained.

Note that at least one of the first oxide semiconductor layer 131, the second oxide semiconductor layer 132, and the third oxide semiconductor layer 133 preferably contains a crystal part. For example, the first oxide semiconductor layer 131 is amorphous, and the second oxide semiconductor layer 132 and the third oxide semiconductor layer 133 each include a crystal part. Since the second oxide semiconductor layer 132 where a channel is formed includes a crystal part, the transistor can have stable electrical characteristics.

In particular, a crystal part included in each of the second oxide semiconductor layer 132 and the third oxide semiconductor layer 133 preferably includes a crystal whose c-axis is aligned in a direction approximately perpendicular to its surface.

In the transistor having the structure in FIGS. 1A to 1C, the third oxide semiconductor layer 133 is in contact with the source electrode layer 140 and the drain electrode layer 150, and it is preferable that the energy gap of the third oxide semiconductor layer 133 be not large like an insulator and the film thickness be small in order that current can be extracted efficiently. Further, in the case where an In—Ga—Zn oxide is used for the oxide semiconductor layer 130, it is preferable that the third oxide semiconductor layer 133 contain less In than the second oxide semiconductor layer 132 so that diffusion of In to the gate insulating film can be prevented.

Figure 5A:
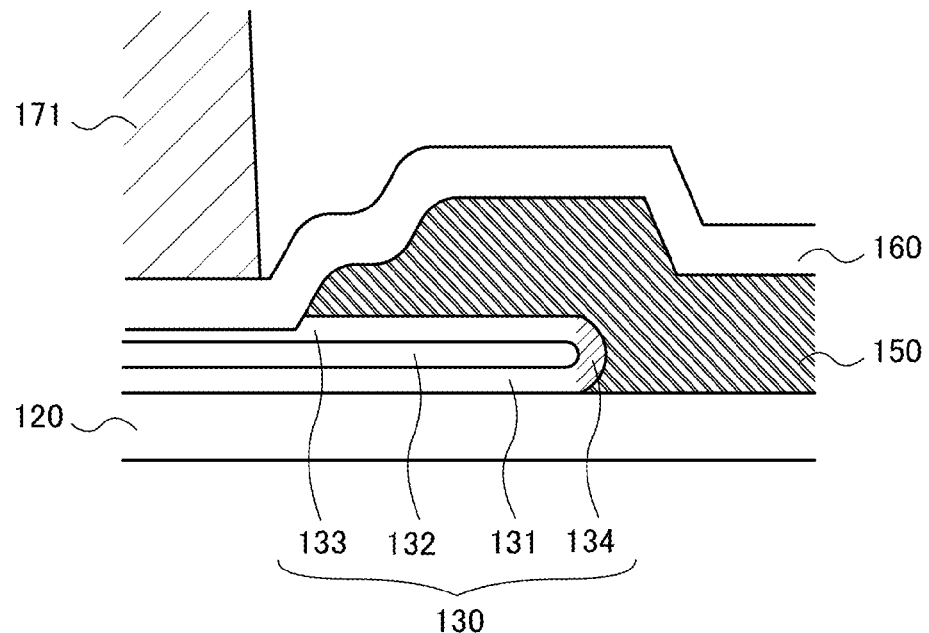
FIGS. 5A and 5B are each an enlarged cross-sectional view of a transistor.

As illustrated in an enlarged view of the transistor in FIG. 5A, a region 134 having a curved surface may be provided at an end portion of the oxide semiconductor layer 130. In the case where the oxide semiconductor layer 130 is formed using an In-M-Zn oxide (M is Al, Ti, Ga, Y, Zr, La, Ce, Nd, or Hf), the amount of M (MS4) contained in the region 134 is preferably larger than that of M (MS2) contained in the second oxide semiconductor layer 132. Further preferably, the amount of MS4 is the same as that of M (MS1) contained in the first oxide semiconductor layer 131.

The region 134 at the end portion of the oxide semiconductor layer 130 can be formed in such a manner that the components of the first oxide semiconductor layer 131 are attached to the second oxide semiconductor layer 132 and the third oxide semiconductor layer 133 by a dry etching method, i.e. by utilizing what is called a rabbit ear. Further, when the etching gas component attached at the formation of the rabbit ear is removed and the M component is oxidized by oxidation treatment, the insulating property of the region 134 can be improved.

Figure 5B:
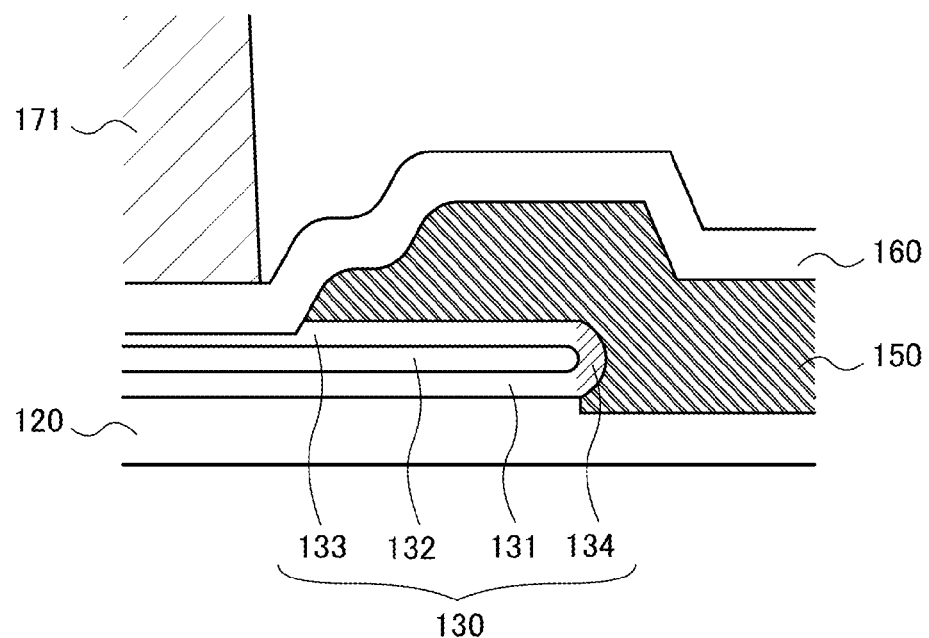

Further, the base insulating film 120 illustrated in FIG. 5B is partly etched when the oxide semiconductor layer 130 is subjected to dry etching. Therefore, a region of the base insulating film 120, which is in contact with the oxide semiconductor layer 130, is thicker than a region of the base insulating film 120, which is not in contact with the oxide semiconductor layer 130. With such a structure, the adhesion between the oxide semiconductor layer 130 and the source electrode layer 140 or the drain electrode layer 150 can be improved.

Figure 6A:
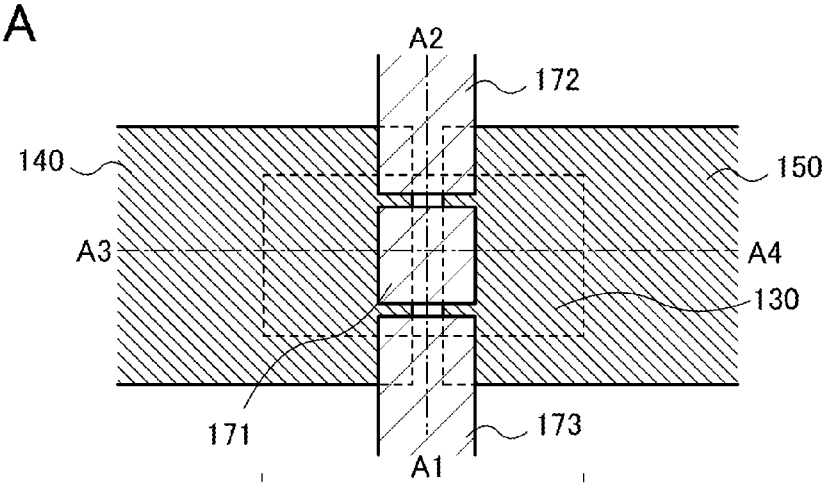
FIG. 6A is a top view and a cross-sectional view which illustrate a transistor.
Figure 6A:
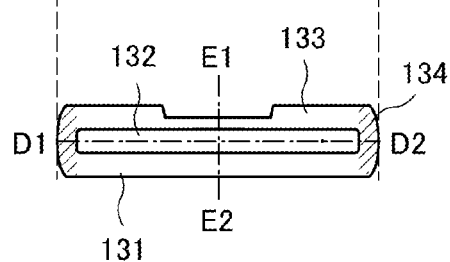

FIG. 6A is a top view of the transistor illustrated in FIGS. 1A to 1C and a cross-sectional view of the oxide semiconductor layer 130. The region 134 of the oxide semiconductor layer 130 overlapping with the gate electrode layers are likely to be changed to an n-type because impurities due to an external factor are mixed therein or an oxygen vacancy is generated; thus, the region 134 acts as a parasitic channel in some cases. It is particularly noticeable that the second oxide semiconductor layer 132 having a small energy gap is likely to be changed to an n-type; therefore, the region 134 covering the second oxide semiconductor layer 132 has an effect of suppressing generation of a parasitic channel.

When the main components of the first oxide semiconductor layer 131 are the same as those of the region 134, the effect of suppressing generation of a parasitic channel can be more enhanced as a difference ($\Delta E$) between energy (EcS2) at the bottom of the conduction band of the second oxide semiconductor layer 132 and energy (EcS4) at a bottom of a conduction band of the region 134 gets larger. Further, the region 134 is preferably thicker than the first oxide semiconductor layer 131 or the third oxide semiconductor layer 133, and generation of a parasitic channel due to change of the end portion of the second oxide semiconductor layer 132 to an n-type can be suppressed as the region 134 gets thicker.

Figure 6B:
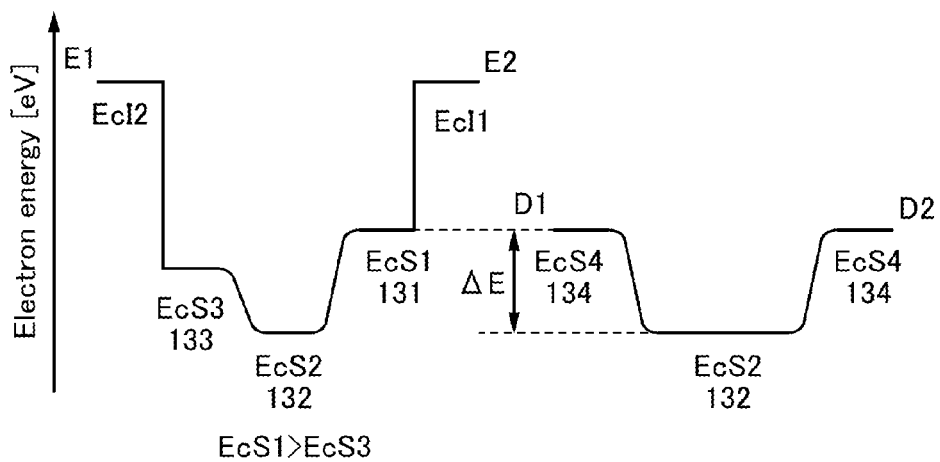
FIG. 6B illustrates a band structure of oxide semiconductor layers.

When the compositions of the first oxide semiconductor layer 131, the second oxide semiconductor layer 132, and the third oxide semiconductor layer 133 are approximate to one another, in the region 134, the energies at the bottoms of the conduction bands of the oxide semiconductor layers are changed continuously as in FIG. 6B which illustrates part of the band structure of the oxide semiconductor layer 130. That is, it can be said that the first oxide semiconductor layer 131, the second oxide semiconductor layer 132, the third oxide semiconductor layer 133, and the region 134 form continuous junctions. Note that the direction of a dashed-dotted line D1-D2 and the direction of a dashed-dotted line E1-E2 in FIG. 6B corresponds to the direction of a dashed-dotted line D1-D2 and the direction of a dashed-dotted line E1-E2 in the cross-sectional view of the oxide semiconductor layer 130 in FIG. 6A, respectively.

For the source electrode layer 140 and the drain electrode layer 150, a conductive material which is easily bonded to oxygen can be used. For example, Al, Cr, Cu, Ta, Ti, Mo, or W can be used. In particular, W with a high melting point is preferably used, which allows subsequent process temperatures to be relatively high. Note that the conductive material which is easily bonded to oxygen includes, in its category, a material to which oxygen is easily diffused.

Figure 19A:
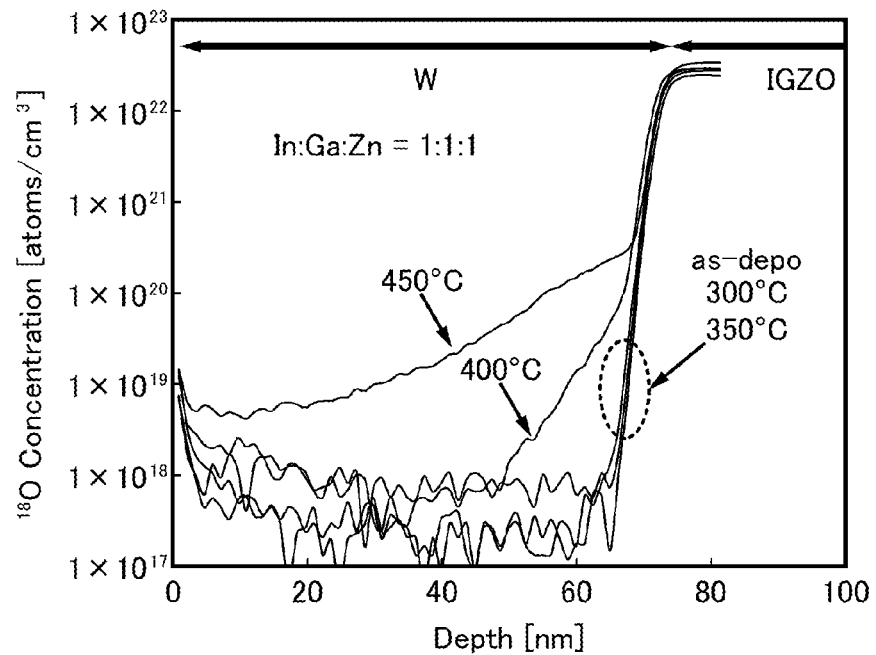
FIGS. 19A and 19B each show SIMS analysis results of a stack of an IGZO film and a tungsten film.
Figure 19B:
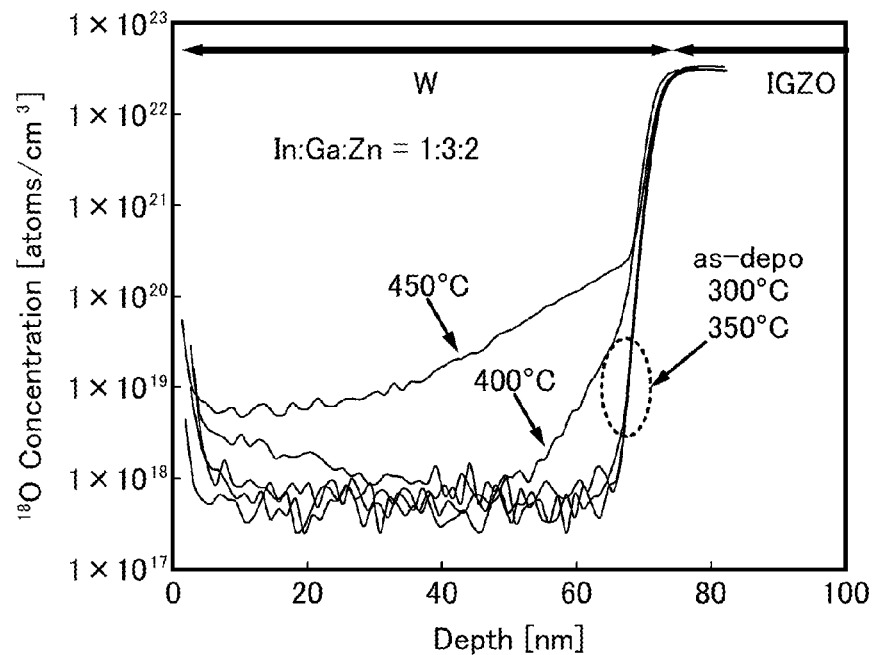

When the conductive material which is easily bonded to oxygen is in contact with the oxide semiconductor layer, a phenomenon occurs in which oxygen of the oxide semiconductor layer is diffused to the conductive material which is easily bonded to oxygen. For example, FIGS. 19A and 19B each show SIMS analysis results of profiles of an oxygen isotope ($^{18}O$) in a depth direction before and after heat treatment in samples which were each fabricated with a stack of an In—Ga—Zn oxide film (hereinafter also referred to as an IGZO film) and a tungsten film by a sputtering method. Note that the IGZO film is formed by a DC sputtering method with a sputtering target containing In, Ga, and Zn in an atomic ratio of 1:1:1 or 1:3:2 and a sputtering gas containing Ar and $O_2$ ($^{18}O$) in a flow rate ratio of 2:1. The tungsten film is formed by a DC sputtering method with a metal (W) used as a sputtering target and a 100 percent Ar gas used as a sputtering gas. Note that heat treatment was performed at 300° C., 350° C., 400° C., and 450° C. each for one hour, and five samples including a sample which was not subjected to heat treatment were compared with one another. As shown in FIGS. 19A and 19B, as the temperature of the heat treatment is increased, oxygen of the oxide semiconductor layer is diffused to the tungsten film.

Since the fabrication process of the transistor involves some heat treatment steps, the above phenomenon causes generation of oxygen vacancies in a region of the oxide semiconductor layer, which is in contact with the source electrode or the drain electrode, and the region is changed to an n-type. Thus, the n-type region can serve as a source or a drain of the transistor.

However, in the case of forming a transistor with an extremely short channel length, the n-type region which is formed by the generation of oxygen vacancies sometimes extends in the channel length direction of the transistor. In that case, electrical characteristics of the transistor change; for example, the threshold voltage is shifted or on and off of the transistor cannot be controlled with the gate voltage (i.e., the transistor is on). Accordingly, when a transistor with an extremely short channel length is formed, it is not preferable that the conductive material which is easily bonded to oxygen be used for a source electrode layer and a drain electrode layer.

Figure 7A:
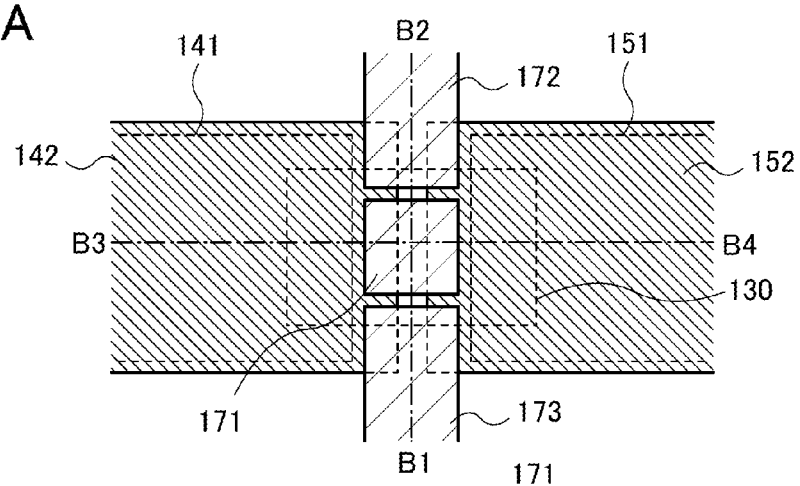
FIGS. 7A to 7C are a top view and cross-sectional views which illustrate a transistor.
Figure 7B:
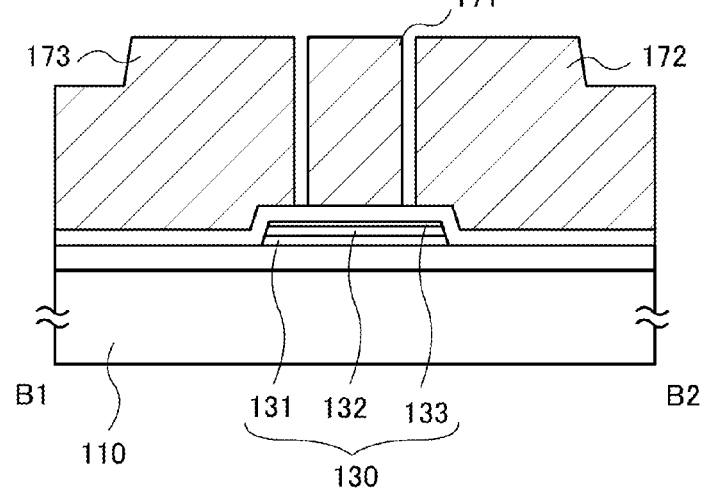
Figure 7C:
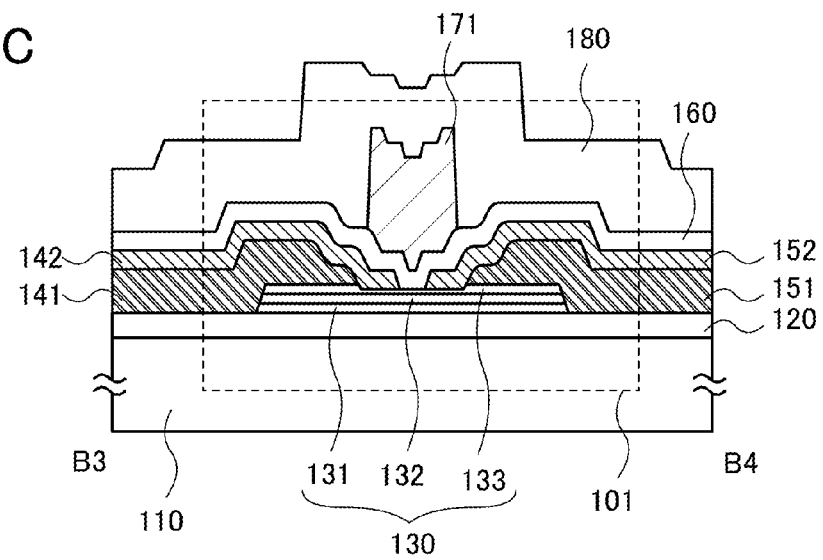

Therefore, as in a transistor 101 illustrated in FIGS. 7A to 7C, a source electrode layer and a drain electrode layer each may have a stacked-layer structure. FIG. 7A is a top view, and a cross section taken along a dashed-dotted line B1-B2 in FIG. 7A is illustrated in FIG. 7B. A cross section taken along a dashed-dotted line B3-B4 in FIG. 7A is illustrated in FIG. 7C. In some cases, the direction of the dashed-dotted line B1-B2 is referred to as a channel width direction, and the direction of the dashed-dotted line B3-B4 is referred to as a channel length direction. The above tungsten film is used for a first source electrode layer 141 and a first drain electrode layer 151, and a conductive material which is not easily bonded to oxygen is used for a second source electrode layer 142 and a second drain electrode layer 152 which determine the channel length. As the conductive material which is not easily bonded to oxygen, for example, tantalum nitride, titanium nitride, ruthenium, or the like is preferably used. Note that the conductive material which is not easily bonded to oxygen includes, in its category, a material to which oxygen is not easily diffused.

Figure 20A:
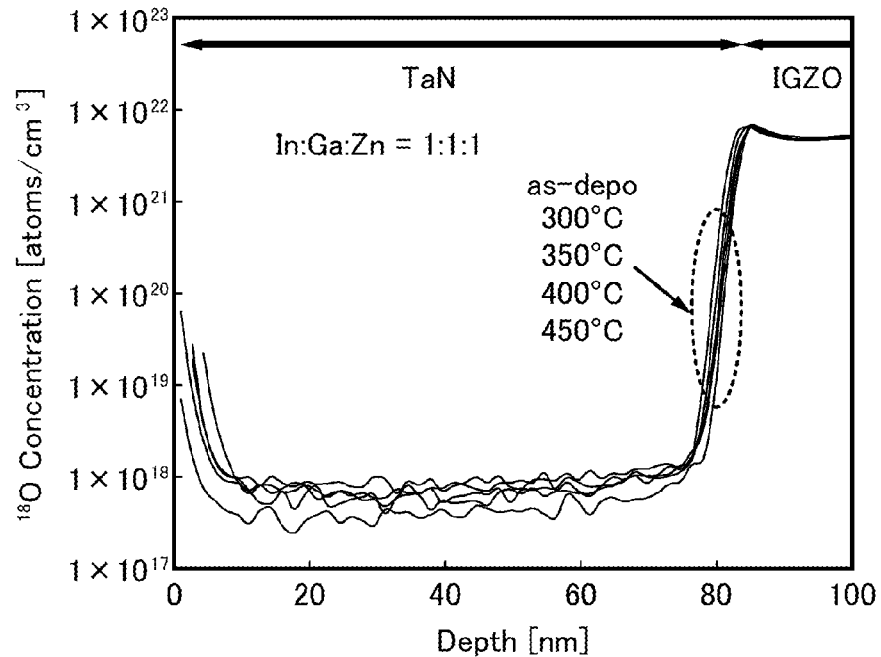
FIGS. 20A and 20B each show SIMS analysis results of a stack of an IGZO film and a tantalum nitride film.
Figure 20B:
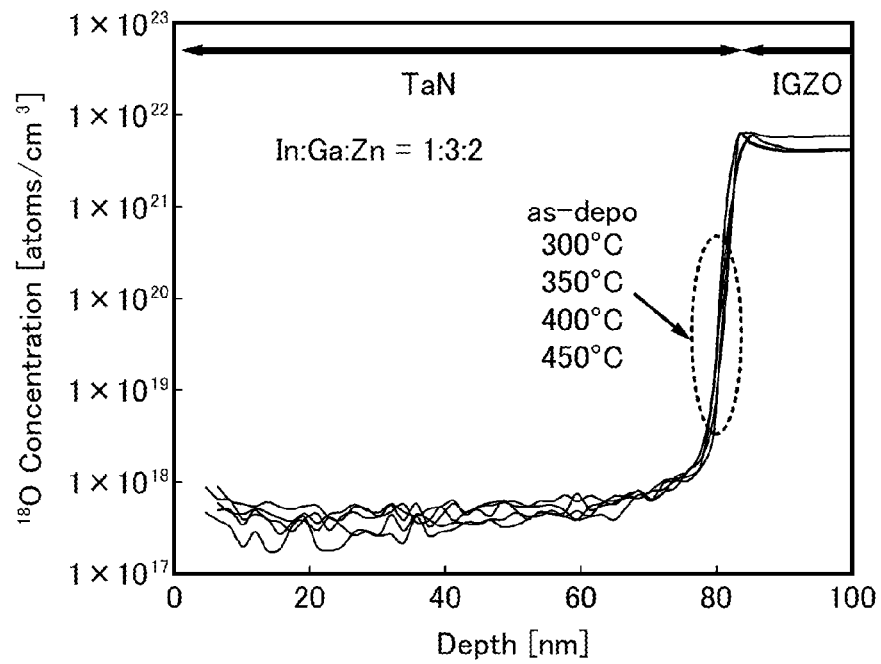
Figure 21A:
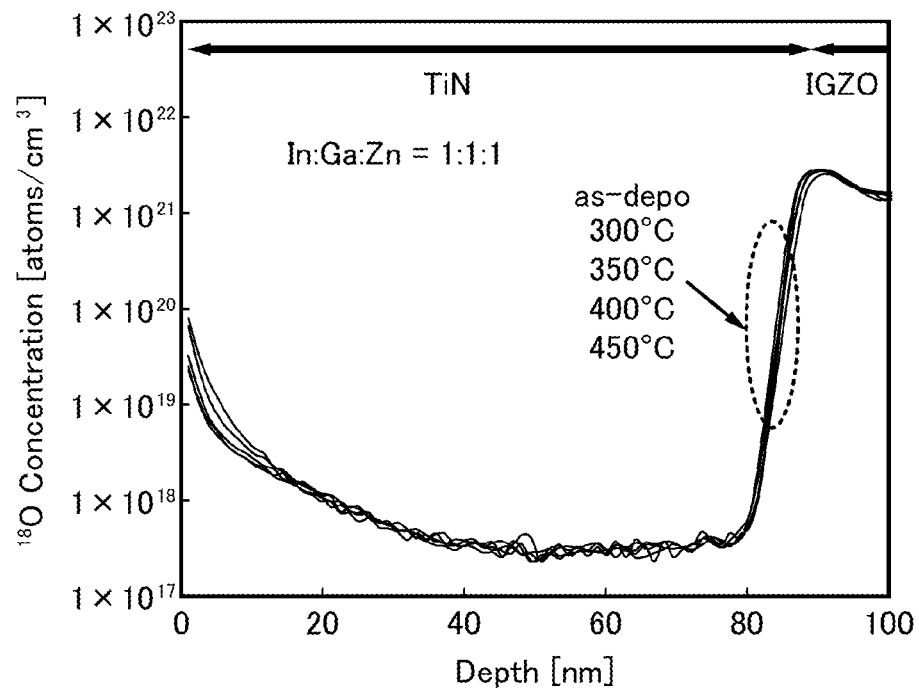
FIGS. 21A and 21B each show SIMS analysis results of a stack of an IGZO film and a titanium nitride film.
Figure 21B:
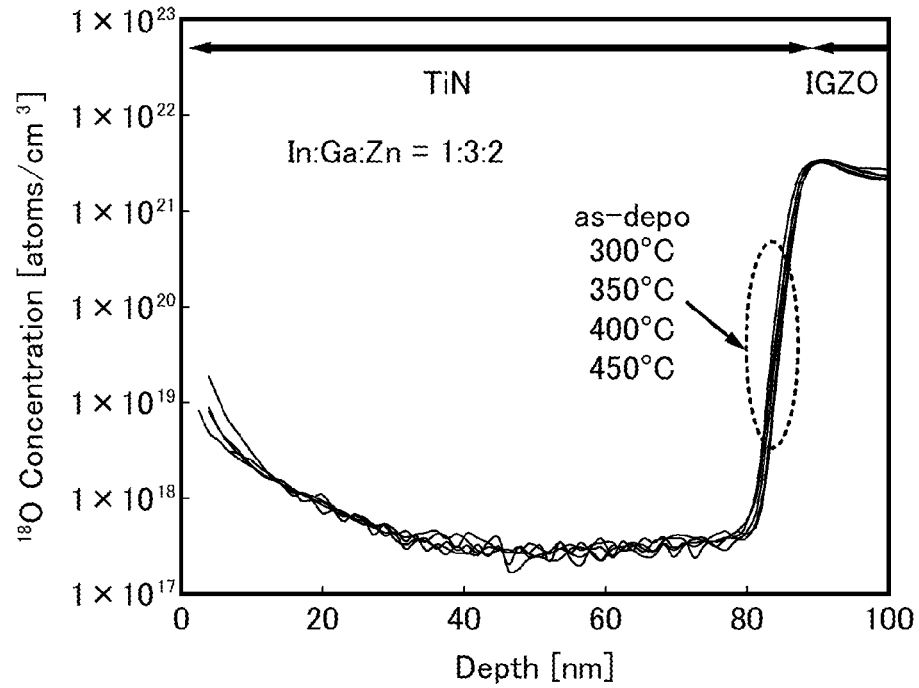

FIGS. 20A and 20B each show SIMS analysis results of profiles of an oxygen isotope ($^{18}O$) in a depth direction before and after heat treatment in samples which were each fabricated with a stack of an IGZO film and a tantalum nitride film by a sputtering method. FIGS. 21A and 21B each show SIMS analysis results of profiles of an oxygen isotope ($^{18}O$) in a depth direction before and after heat treatment in samples which were each fabricated with a stack of an IGZO film and a titanium nitride film by a sputtering method.

The IGZO film was formed by a DC sputtering method with a sputtering target containing In, Ga, and Zn in an atomic ratio of 1:1:1 or 1:3:2 and a sputtering gas containing Ar and $O_2$ ($^{18}O$) at a flow rate ratio of 2:1. The tantalum nitride film was formed by a reactive sputtering method (a DC sputtering method) with a metal (Ta) used as a sputtering target and a sputtering gas containing Ar and $N_2$ at a flow rate ratio of 5:1, and the titanium nitride film was formed by a reactive sputtering method (a DC sputtering method) with a metal (Ti) used as a sputtering target and a 100 percent $N_2$ gas used as a sputtering gas. Note that heat treatment was performed at 300° C., 350° C., 400° C., and 450° C. each for one hour, and five samples including a sample which was not subjected to heat treatment were compared with one another.

In any of the samples, diffusion of oxygen to the tantalum nitride film or the titanium nitride film was not observed and its behavior was different from that of the sample with the tungsten film in FIGS. 19A and 19B. Accordingly, it can be said that the tantalum nitride film and the titanium nitride film are each a film that is not easily bonded to oxygen or a film to which oxygen is not easily diffused.

Note that in the transistor having the structure illustrated in FIGS. 7A to 7C, a channel length refers to a distance between the second source electrode layer 142 and the second drain electrode layer 152.

Further, in the transistor having the structure illustrated in FIGS. 7A to 7C, a channel refers to a region of the second oxide semiconductor layer 132, which is between the second source electrode layer 142 and the second drain electrode layer 152.

Furthermore, in the transistor having the structure illustrated in FIGS. 7A to 7C, a channel formation region refers to a region of the stack of the first oxide semiconductor layer 131, the second oxide semiconductor layer 132, and the third oxide semiconductor layer 133, which is between the second source electrode layer 142 and the second drain electrode layer 152.

By the use of the above conductive material which is not easily bonded to oxygen for the second source electrode layer 142 and the second drain electrode layer 152, generation of oxygen vacancies in the channel formation region of the oxide semiconductor layer can be suppressed, so that change of the channel to an n-type can be suppressed. In this manner, even a transistor with an extremely short channel length can have favorable electrical characteristics.

In the case where the source electrode layer and the drain electrode layer are formed using only the above conductive material which is not easily bonded to oxygen, the contact resistance with the oxide semiconductor layer 130 becomes too high; thus, it is preferable that as illustrated in FIG. 7C, the first source electrode layer 141 and the first drain electrode layer 151 be formed over the oxide semiconductor layer 130 and the second source electrode layer 142 and the second drain electrode layer 152 be formed so as to cover the first source electrode layer 141 and the first drain electrode layer 151.

At this time, it is preferable that the oxide semiconductor layer 130 have a large contact area with the first source electrode layer 141 or the first drain electrode layer 151, and the oxide semiconductor layer 130 have a small contact area with the second source electrode layer 142 or the second drain electrode layer 152. The region of the oxide semiconductor layer 130, which is in contact with the first source electrode layer 141 or the first drain electrode layer 151, is changed to an n-type region due to generation of oxygen vacancies. Owing to the n-type region, the contact resistance between the oxide semiconductor layer 130 and the first source electrode layer 141 or the first drain electrode layer 151 can be reduced. Accordingly, when the oxide semiconductor layer 130 has a large contact area with the first source electrode layer 141 or the first drain electrode layer 151, the area of the n-type region can also be large.

Note that the oxide semiconductor layer 130 does not necessary have a large contact area with the first source electrode layer 141 or the first drain electrode layer 151 in the case where a nitride such as tantalum nitride or titanium nitride is used for the second source electrode layer 142 and the second drain electrode layer 152. This is because when nitrogen in the nitride is slightly diffused to a region of the oxide semiconductor layer 130, which is close to the interface with the second source electrode layer 142 and the second drain electrode layer 152, nitrogen acts as a donor and forms an n-type region in the oxide semiconductor layer 130; accordingly, the contact resistance between the oxide semiconductor layer 130 and the second source electrode layer 142 or the second drain electrode layer 152 can be reduced.

The distance L1 between the first source electrode layer 141 and the first drain electrode layer 151 is set to 0.8 μm or longer, preferably 1.0 μm or longer. In the case where L1 is shorter than 0.8 μm, influence of oxygen vacancies generated in the channel formation region cannot be eliminated, which causes deterioration of the electrical characteristics of the transistor.

Even when the distance L2 between the second source electrode layer 142 and the second drain electrode layer 152 is, for example, 30 nm or shorter, the transistor can have favorable electrical characteristics.

Further, it is preferable to employ a structure in which a gate electrode layer does not overlap with a source electrode layer or a drain electrode layer as much as possible in order to make small parasitic capacitance which is caused between a gate and a drain and between the gate and a source, which enables the frequency characteristics of a semiconductor device to be improved.

Furthermore, the end portions of the source electrode layer 140 and the drain electrode layer 150 illustrated in FIGS. 1A to 1C and the end portions of the first source electrode layer 141 and the first drain electrode layer 151 illustrated in FIGS. 7A to 7C preferably have staircase-like shapes including a plurality of steps. With such shapes including a plurality of steps, coverage with the films formed over the source electrode layer 140 and the drain electrode layer 150, or the first source electrode layer 141 and the first drain electrode layer 151 can be improved, whereby the electrical characteristics and long-term reliability of the transistor can be improved.

The gate insulating film 160 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The gate insulating film 160 may be a stack of any of the above materials.

For the first gate electrode layer 171, the second gate electrode layer 172, and the third gate electrode layer 173, a conductive film formed using Al, Ti, Cr, Co, Ni, Cu, Y, Zr, Mo, Ru, Ag, Ta, W, or the like can be used. Each gate electrode layer may be a stack of any of the above materials.

The first gate electrode layer 171, the second gate electrode layer 172, and the third gate electrode layer 173 are each provided separately. The first gate electrode layer 171 overlaps with the oxide semiconductor layer 130 with the gate insulating film 160 provided therebetween. The second gate electrode layer 172 partly covers one end portion of the oxide semiconductor layer 130 in the channel width direction with the gate insulating film 160 provided therebetween. The third gate electrode layer 173 partly covers the other end portion of the oxide semiconductor layer 130 in the channel width direction with the gate insulating film 160 provided therebetween.

In order to fabricate a semiconductor device with low power consumption, it is effective to reduce an off-state current of a transistor, in particular, a current thereof when a gate voltage is 0 V (such a current is also referred to as Icut). In order to reduce Icut, what is called a back gate structure which controls the threshold voltage of a transistor in the following manner is known: an electrode is provided on the side opposite to a gate electrode of a transistor with an active layer provided therebetween and an appropriate potential is supplied to the electrode. However, in the case where the active layer is formed using an oxide semiconductor as in the transistor of one embodiment of the present invention, it is appropriate to use a thick oxide insulating layer as a base insulating film which supplies oxygen to the oxide semiconductor. Therefore, in the back gate structure, there are problems in that the potential of the back gate needs to be set high and the number of steps is increased to provide a back gate.

In the transistor of one embodiment of the present invention, the first gate electrode layer 171 controls switching of the transistor, and the second gate electrode layer 172 and the third gate electrode layer 173 each control the threshold voltage of the transistor. In the operation of the transistor, a potential for turning on or off the transistor is supplied to the first gate electrode layer 171, and a fixed potential for controlling the threshold voltage of the transistor is supplied to each of the second gate electrode layer 172 and the third gate electrode layer 173. The second gate electrode layer 172 and the third gate electrode layer 173 may be supplied with the same potential or different potentials.

When the second gate electrode layer 172 and the third gate electrode layer 173 having an effect similar to that of a back gate are formed on a thin gate insulating film side, which is on the same side as the first gate electrode layer 171, as described above, a potential for supplying the threshold voltage can be lowered. Note that the first gate electrode layer 171, the second gate electrode layer 172, and the third gate electrode layer 173 can be simultaneously formed; thus, the number of steps is not increased. Moreover, the oxide insulating layer serving as a base insulating film can be formed thick. It is preferable that the base insulating film be partly etched as illustrated in FIG. 5B in order that the potentials of the second gate electrode layer 172 and the third gate electrode layer 173 can be efficiently applied to the active layer of the transistor.

As described above, the threshold voltage of the transistor can be controlled by supply of a fixed potential to each of the second gate electrode layer 172 and the third gate electrode layer 173; accordingly, Icut can be reduced and the long-term reliability of the semiconductor device can be improved.

The oxide insulating layer 180 may be formed over the gate insulating film 160, the first gate electrode layer 171, the second gate electrode layer 172, and the third gate electrode layer 173. The oxide insulating layer 180 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The oxide insulating layer 180 may be a stack of any of the above materials.

Here, the oxide insulating layer 180 preferably contains excess oxygen. An oxide insulating layer containing excess oxygen refers to an oxide insulating layer from which oxygen can be released by heat treatment or the like. The oxide insulating layer containing excess oxygen is preferably a film in which the amount of released oxygen when converted into oxygen atoms is $1.0 \times 10^{19}$ atoms/cm$^3$ or more in thermal desorption spectroscopy analysis. Oxygen released from the oxide insulating layer 180 can be diffused to a channel formation region of the oxide semiconductor layer 130 through the gate insulating film 160, so that oxygen vacancies which are undesirably formed can be filled with the oxygen. In this manner, stable electrical characteristics of the transistor can be achieved.

The above is the description of the transistor of one embodiment of the present invention. The transistor has favorable electrical characteristics, so that a semiconductor device having high long-term reliability can be provided.

This embodiment can be combined as appropriate with any of the other embodiments in this specification.

Embodiment 2

In this embodiment, a transistor having a structure different from that of the transistor described in Embodiment 1 will be described.

Figure 8A:
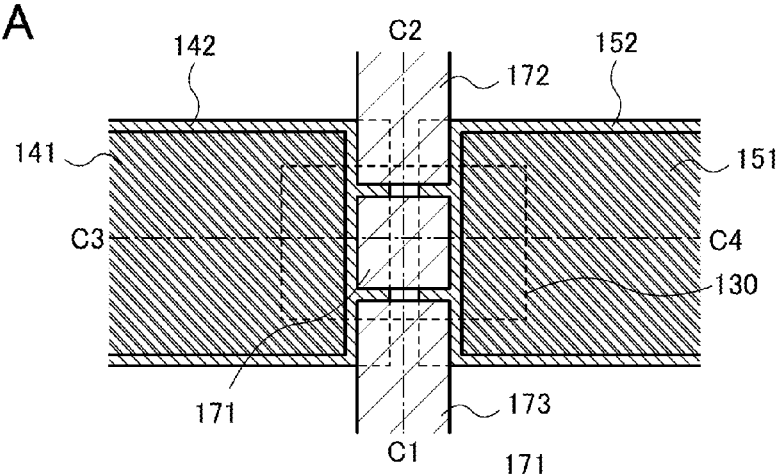
FIGS. 8A to 8C are a top view and cross-sectional views which illustrate a transistor.
Figure 8B:
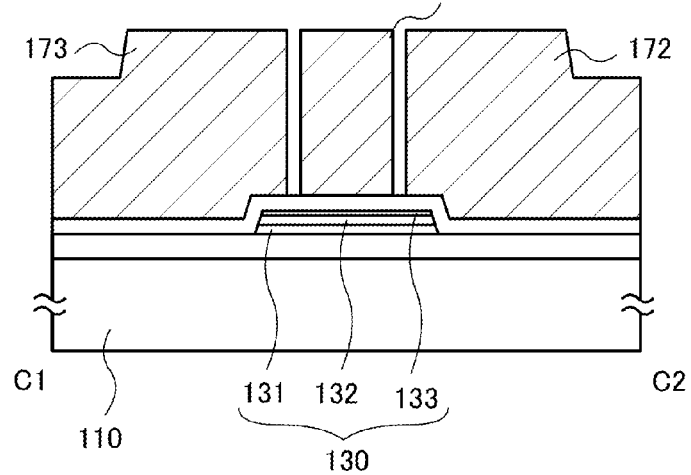
Figure 8C:
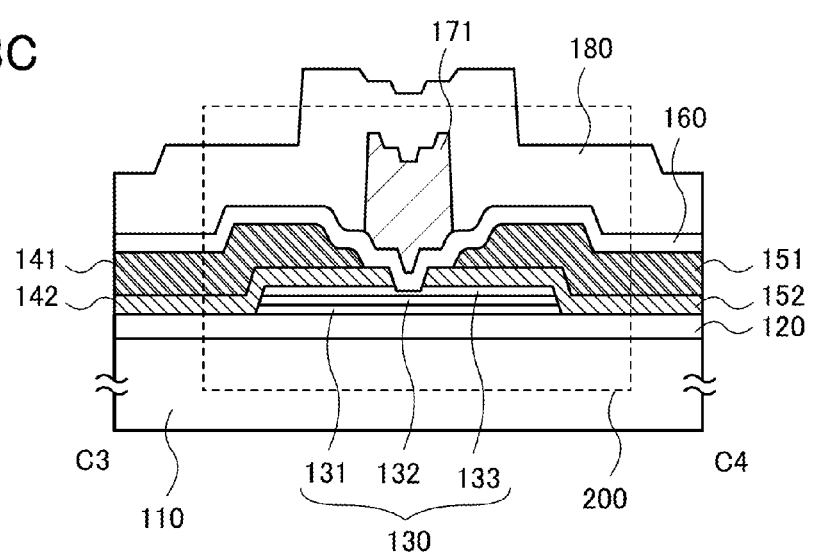

FIGS. 8A, 8B, and 8C are a top view and cross-sectional views which illustrate a transistor of one embodiment of the present invention. FIG. 8A is the top view, and a cross section taken along a dashed-dotted line C1-C2 in FIG. 8A is illustrated in FIG. 8B. A cross section taken along a dashed-dotted line C3-C4 in FIG. 8A is illustrated in FIG. 8C. Note that for simplification of the drawing, some components in the top view in FIG. 8A are not illustrated. In some cases, the direction of the dashed-dotted line C1-C2 is referred to as a channel width direction, and the direction of the dashed-dotted line C3-C4 is referred to as a channel length direction.

A transistor 200 illustrated in FIGS. 8A, 8B, and 8C includes the base insulating film 120 formed over the substrate 110; the oxide semiconductor layer 130 formed over the base insulating film 120; the second source electrode layer 142 and the second drain electrode layer 152 formed over the oxide semiconductor layer 130; the first source electrode layer 141 and the first drain electrode layer 151 formed over the second source electrode layer 142 and the second drain electrode layer 152, respectively; the gate insulating film 160 formed over the first source electrode layer 141, the second source electrode layer 142, the first drain electrode layer 151, the second drain electrode layer 152, and the oxide semiconductor layer 130; the first gate electrode layer 171, the second gate electrode layer 172, and the third gate electrode layer 173 formed over the gate insulating film 160; and the oxide insulating layer 180 formed over the gate insulating film 160, the first gate electrode layer 171, the second gate electrode layer 172, and the third gate electrode layer 173. Note that the oxide insulating layer 180 may be provided as needed and another insulating layer may be further provided thereover.

The transistor 200 illustrated in FIGS. 8A to 8C is similar to the transistor 101 illustrated in FIGS. 7A to 7C except for the stack order of the first source electrode layer 141 and the second source electrode layer 142 and the stack order of the first drain electrode layer 151 and the second drain electrode layer 152. Like the transistor 100 or the transistor 101 described in Embodiment 1, the transistor 200 includes the first gate electrode layer 171, the second gate electrode layer 172, and the third gate electrode layer 173.

Since the first source electrode layer 141 and the first drain electrode layer 151 are not in contact with the oxide semiconductor layer 130 in the transistor 200, an oxygen vacancy due to the first source electrode layer 141 or the first drain electrode layer 151 is not generated in the oxide semiconductor layer 130. Thus, an n-type region formed by the oxygen vacancy, which serves as a source or a drain, is not formed.

In the transistor 200, the conductive nitride (tantalum nitride or titanium nitride) described in Embodiment 1 is used for the second source electrode layer 142 and the second drain electrode layer 152. Therefore, nitrogen acting as a donor can be diffused from the nitride to a region of the oxide semiconductor layer 130, which is close to the interface with the second source electrode layer 142 and the second drain electrode layer 152, so that the region to which nitrogen is diffused can serve as a source or a drain. Note that nitrogen is sometimes diffused in a channel length direction; thus, it is preferable to remove part of a channel formation region as illustrated in FIG. 8C. The part of the channel formation region can be removed through an etching step at the formation of the second source electrode layer 142 and the second drain electrode layer 152. Note that it is not necessary to diffuse nitrogen deeply to the oxide semiconductor layer 130 because the region of the oxide semiconductor layer 130, which is close to the interface with the second source electrode layer 142 and the second drain electrode layer 152, can sufficiently serve as a source or a drain by diffusing nitrogen only thereto.

Further, since an oxygen vacancy due to the first source electrode layer 141 or the first drain electrode layer 151 is not generated in the oxide semiconductor layer 130 in the transistor 200, the distance between the first source electrode layer 141 and the first drain electrode layer 151 can be made shorter than the distance between the source electrode layer 140 and the drain electrode layer 150 in the transistor 100. For example, an end surface of the second source electrode layer 142 may be aligned with an end surface of the first source electrode layer 141, and an end surface of the second drain electrode layer 152 may be aligned with an end surface of the first drain electrode layer 151. With such a structure, the resistance of the whole source electrode layer and the whole drain electrode layer can be reduced.

The above is the description of the transistor of one embodiment of the present invention. The transistor has favorable electrical characteristics, so that a semiconductor device having high long-term reliability can be provided.

This embodiment can be combined as appropriate with any of the other embodiments in this specification.

Embodiment 3

In this embodiment, a transistor having a structure different from that of the transistor described in Embodiments 1 and 2 will be described.

Figure 9A:
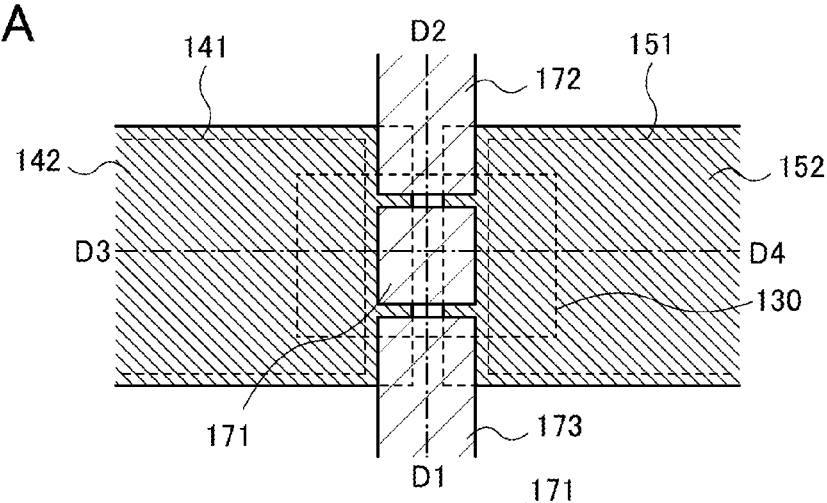
FIGS. 9A to 9C are a top view and cross-sectional views which illustrate a transistor.
Figure 9B:
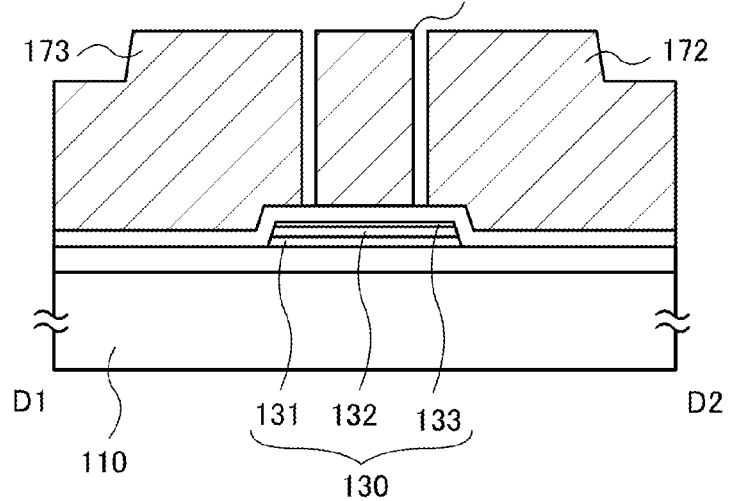
Figure 9C:
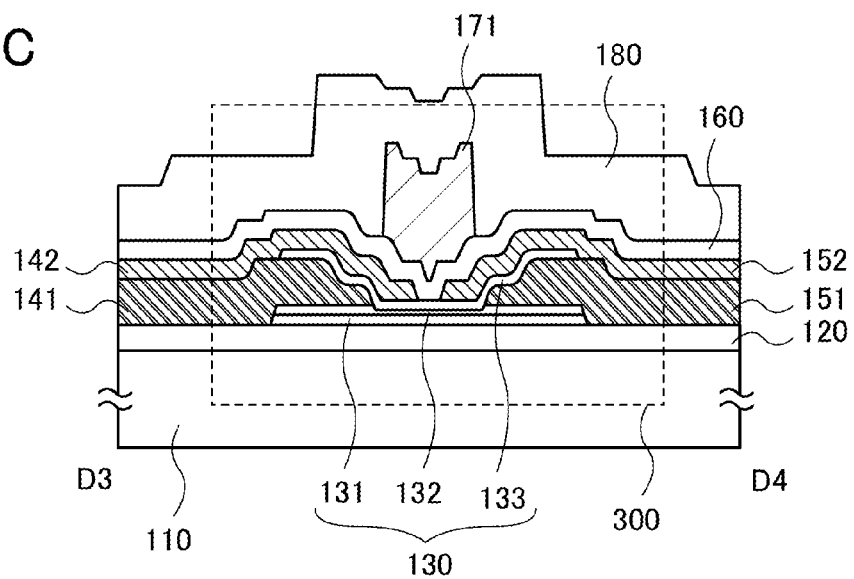

FIGS. 9A, 9B, and 9C are a top view and cross-sectional views which illustrate a transistor of one embodiment of the present invention. FIG. 9A is the top view, and a cross section taken along a dashed-dotted line D1-D2 in FIG. 9A is illustrated in FIG. 9B. A cross section taken along a dashed-dotted line D3-D4 in FIG. 9A is illustrated in FIG. 9C. Note that for simplification of the drawing, some components in the top view in FIG. 9A are not illustrated. In some cases, the direction of the dashed-dotted line D1-D2 is referred to as a channel width direction, and the direction of the dashed-dotted line D3-D4 is referred to as a channel length direction.

A transistor 300 illustrated in FIGS. 9A, 9B, and 9C includes the base insulating film 120 formed over the substrate 110; the first oxide semiconductor layer 131 and the second oxide semiconductor layer 132 formed over the base insulating film 120; the first source electrode layer 141 and the first drain electrode layer 151 formed over the second oxide semiconductor layer 132; the third oxide semiconductor layer 133 formed over the second oxide semiconductor layer 132, the first source electrode layer 141, and the first drain electrode layer 151; the second source electrode layer 142 which covers the first source electrode layer 141 and is in contact with the first source electrode layer 141 and the third oxide semiconductor layer 133; the second drain electrode layer 152 which covers the first drain electrode layer 151 and is in contact with the first drain electrode layer 151 and the third oxide semiconductor layer 133; the gate insulating film 160 formed over the third oxide semiconductor layer 133, the second source electrode layer 142, and the second drain electrode layer 152; the first gate electrode layer 171, the second gate electrode layer 172, and the third gate electrode layer 173 formed over the gate insulating film 160; and the oxide insulating layer 180 formed over the gate insulating film 160, the first gate electrode layer 171, the second gate electrode layer 172, and the third gate electrode layer 173. Note that the oxide insulating layer 180 may be provided as needed and another insulating layer may be further provided thereover.

The transistor 300 illustrated in FIGS. 9A to 9C is similar to the transistor 101 illustrated in FIGS. 7A to 7C except that the third oxide semiconductor layer 133 is formed over the first source electrode layer 141 and the first drain electrode layer 151. Like the transistor 100 or the transistor 101 described in Embodiment 1, the transistor 300 includes the first gate electrode layer 171, the second gate electrode layer 172, and the third gate electrode layer 173.

In the transistor 300, the second oxide semiconductor layer 132 where a channel is formed is in contact with the first source electrode layer 141 and the first drain electrode layer 151; thus, high-density oxygen vacancies are generated in the second oxide semiconductor layer 132 and accordingly an n-type region is formed. Therefore, there is a few resistance component in a carrier path and carriers can be transported efficiently.

Further, since the third oxide semiconductor layer 133 is formed after the first source electrode layer 141 and the first drain electrode layer 151 are formed, the third oxide semiconductor layer 133 is not over-etched when the first source electrode layer 141 and the first drain electrode layer 151 are formed. Therefore, the second oxide semiconductor layer 132 where a channel is formed can be sufficiently separated from the gate insulating film 160, and the effect of suppressing influence of diffusion of impurities from the interface between the third oxide semiconductor layer 133 and the gate insulating film 160 can be enhanced.

The above is the description of the transistor of one embodiment of the present invention. The transistor has favorable electrical characteristics, so that a semiconductor device having high long-term reliability can be provided.

This embodiment can be combined as appropriate with any of the other embodiments in this specification.

Embodiment 4

In this embodiment, a method for fabricating the transistor 101 described in Embodiment 1 with reference to FIGS. 7A to 7C will be described.

For the substrate 110, a glass substrate, a ceramic substrate, a quartz substrate, a sapphire substrate, or the like can be used. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used. Still alternatively, any of these substrates further provided with a semiconductor element may be used.

The base insulating film 120 can be formed by a plasma CVD method, a sputtering method, or the like using an oxide insulating film of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like; a nitride insulating film of silicon nitride, silicon nitride oxide, aluminum nitride, aluminum nitride oxide, or the like; or a mixed material of any of these. Further, a stack of any of the above materials may be used, and at least an upper layer of the base insulating film 120, which is in contact with the oxide semiconductor layer 130, is preferably formed using a material containing oxygen that might serve as a supply source of oxygen to the oxide semiconductor layer 130.

In the case where the surface of the substrate 110 is made of an insulator and there is no influence of impurity diffusion to the oxide semiconductor layer 130 to be formed later, the base insulating film 120 is not necessarily provided.

Figure 10A:
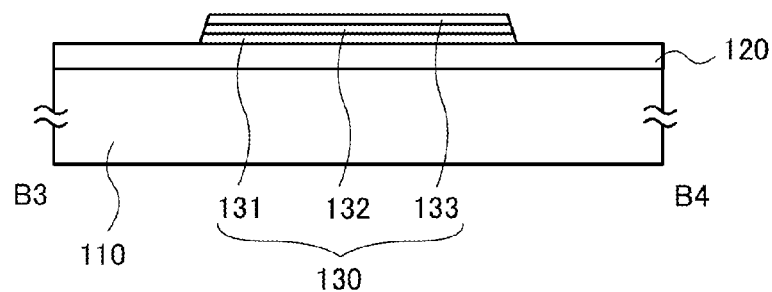
FIGS. 10A to 10C illustrate a method for fabricating a transistor.

Then, the first oxide semiconductor layer 131, the second oxide semiconductor layer 132, and the third oxide semiconductor layer 133 are formed over the base insulating film 120 by a sputtering method, a CVD method, a Molecular Beam Epitaxy (MBE) method, a Metal Organic Chemical Vapor Deposition (MOCVD) method, an Atomic Layer Deposition (ALD) method, or a Pulse Laser Deposition (PLD) method and selectively etched, so that the oxide semiconductor layer 130 is formed (see FIG. 10A). Note that heating may be performed before etching.

For the first oxide semiconductor layer 131, the second oxide semiconductor layer 132, and the third oxide semiconductor layer 133, the material described in Embodiment 1 can be used. For example, the first oxide semiconductor layer 131 can be formed using an In—Ga—Zn oxide whose atomic ratio of In to Ga and Zn is 1:3:2, the second oxide semiconductor layer 132 can be formed using an In—Ga—Zn oxide whose atomic ratio of In to Ga and Zn is 1:1:1, and the third oxide semiconductor layer 133 can be formed using an In—Ga—Zn oxide whose atomic ratio of In to Ga and Zn is 1:3:2.

An oxide semiconductor that can be used for each of the first oxide semiconductor layer 131, the second oxide semiconductor layer 132, and the third oxide semiconductor layer 133 preferably contains at least indium (In) or zinc (Zn). Alternatively, the oxide semiconductor preferably contains both In and Zn. In order to reduce variation in electrical characteristics of the transistor including the oxide semiconductor, the oxide semiconductor preferably contains one or more of stabilizers in addition to In and/or Zn.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) can be given.

As the oxide semiconductor, for example, any of the following can be used: indium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, or an In—Hf—Al—Zn oxide.

Note that an In—Ga—Zn oxide refers to, for example, an oxide containing In, Ga, and Zn as its main components and there is no particular limitation on the ratio of In to Ga and Zn. The In—Ga—Zn oxide may contain a metal element other than In, Ga, and Zn. Further, in this specification, a film formed using an In—Ga—Zn oxide is also referred to as an IGZO film.

Alternatively, a material represented by $InMO_3(ZnO)_m$ (m>0, where m is not an integer) may be used. Note that M represents one or more metal elements selected from Ga, Fe, Mn, and Co. Further alternatively, a material represented by $In_2SnO_5(ZnO)_n$ (n>0, where n is an integer) may be used.

Note that as described in Embodiment 1 in detail, a material of the first oxide semiconductor layer 131 and the third oxide semiconductor layer 133 is selected so that the first oxide semiconductor layer 131 and the third oxide semiconductor layer 133 each have an electron affinity higher than that of the second oxide semiconductor layer 132.

Note that the oxide semiconductor films are each preferably formed by a sputtering method. As a sputtering method, an RF sputtering method, a DC sputtering method, an AC sputtering method, or the like can be used. In particular, a DC sputtering method is preferably used because dust generated in the deposition can be reduced and the film thickness can be uniform.

In the case where an In—Ga—Zn oxide is used for each of the first oxide semiconductor layer 131, the second oxide semiconductor layer 132, and the third oxide semiconductor layer 133, any of materials whose atomic ratio of In to Ga and Zn is 1:1:1, 2:2:1, 3:1:2, 1:3:2, 1:4:3, 1:5:4, 1:6:6, 2:1:3, 1:6:4, 1:9:6, 1:1:4, or 1:1:2 is used so that the first oxide semiconductor layer 131 and the third oxide semiconductor layer 133 have electron affinities higher than that of the second oxide semiconductor layer 132.

Note that for example, the expression "the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The indium content of the second oxide semiconductor layer 132 is preferably higher than those of the first oxide semiconductor layer 131 and the third oxide semiconductor layer 133. In an oxide semiconductor, the s orbital of heavy metal mainly contributes to carrier transfer, and when the proportion of In in the oxide semiconductor is increased, overlap of the s orbitals is likely to be increased. Therefore, an oxide having a composition in which the proportion of In is higher than that of Ga has higher mobility than an oxide having a composition in which the proportion of In is equal to or lower than that of Ga. Thus, with the use of an oxide having a high indium content for the second oxide semiconductor layer 132, a transistor having high mobility can be achieved.

A structure of an oxide semiconductor film is described below.

Note that in this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor including the CAAC-OS film, change in electric characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

For the deposition of the CAAC-OS film, the following conditions are preferably employed.

By reducing the amount of impurities entering the CAAC-OS film during the deposition, the crystal state can be prevented from being broken by the impurities. For example, impurities (e.g., hydrogen, water, carbon dioxide, or nitrogen) which exist in the deposition chamber may be reduced. Further, impurities in a deposition gas may be reduced. Specifically, a deposition gas whose dew point is lower than or equal to −80° C., preferably lower than or equal to −100° C. is used.

By increasing the substrate heating temperature during the deposition, migration of a sputtered particle occurs after the sputtered particle reaches the substrate. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs over the substrate, so that a flat plane of the sputtered particle is attached to the substrate.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

As an example of the sputtering target, an In—Ga—Zn—O compound target is described below.

The In—Ga—Zn—O compound target, which is polycrystalline, is made by mixing InO$_X$ powder, GaO$_Y$ powder, and ZnO$_Z$ powder in a predetermined molar ratio, applying pressure, and performing heat treatment at a temperature higher than or equal to 1000° C. and lower than or equal to 1500° C. Note that X, Y, and Z are each a given positive number. The kinds of powder and the molar ratio for mixing powder may be determined as appropriate depending on the desired sputtering target.

Next, first heat treatment is preferably performed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more in order to compensate desorbed oxygen. By the first heat treatment, the crystallinity of the second oxide semiconductor layer 132 can be improved, and in addition, impurities such as hydrogen and water can be removed from the base insulating film 120, the first oxide semiconductor layer 131, and the third oxide semiconductor layer 133. Note that the step of the first heat treatment may be performed before etching for formation of the oxide semiconductor layer 130.

Then, a first conductive film to be the first source electrode layer 141 and the first drain electrode layer 151 is formed over the oxide semiconductor layer 130. For the first conductive film, Al, Cr, Cu, Ta, Ti, Mo, W, or an alloy material containing any of these as its main component can be used. For example, a 100-nm-thick tungsten film is formed by a sputtering method, an MBE method, an MOCVD method, an ALD method, a PLD method or the like.

Figure 10B:
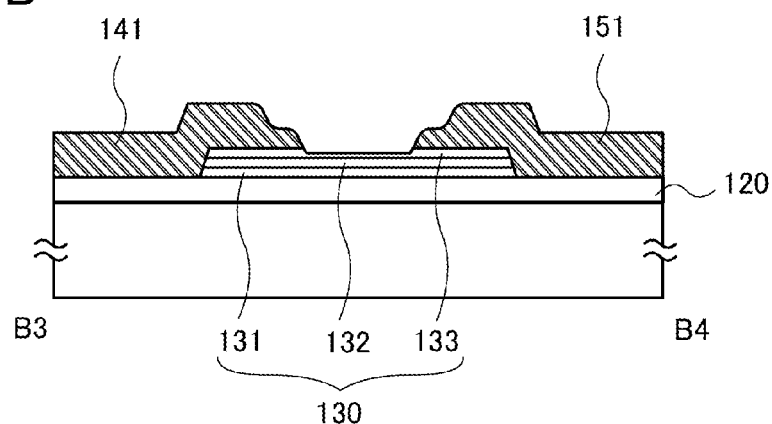
Figure 10C:
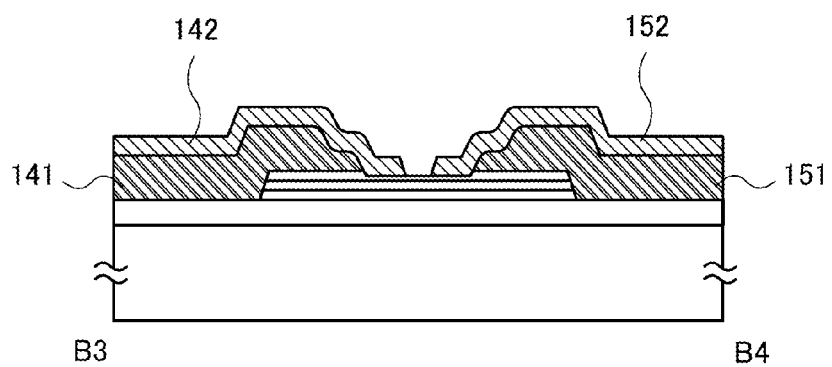

Next, the first conductive film is etched so as to be divided over the oxide semiconductor layer 130, so that the first source electrode layer 141 and the first drain electrode layer 151 are formed (see FIG. 10B). At this time, the end portions of the first source electrode layer 141 and the first drain electrode layer 151 are formed so as to have a staircase-like shape as illustrated in FIGS. 10B and 10C. The end portions can be formed in such a manner that a step of making a resist mask recede by ashing and an etching step are alternately performed plural times.

At this time, the first conductive film is over-etched, so that the oxide semiconductor layer 130 is partly etched as illustrated in FIG. 10B. However, when the etching selectivity of the first conductive film to the oxide semiconductor layer 130 is high, the oxide semiconductor layer 130 is hardly etched.

Then, a second conductive film 800 to be the second source electrode layer 142 and the second drain electrode layer 152 is formed over the oxide semiconductor layer 130, the first source electrode layer 141, and the first drain electrode layer 151. For the second conductive film, tantalum nitride, titanium nitride, ruthenium, or an alloy material containing any of these as its main component can be used. For example, a 20-nm-thick tantalum nitride film is formed by a sputtering method, an MBE method, an MOCVD method, an ALD method, a PLD method or the like.

Next, the second conductive film 800 is etched so as to be divided over the oxide semiconductor layer 130, so that the second source electrode layer 142 and the second drain electrode layer 152 are formed (see FIG. 10C). At this time, part of the oxide semiconductor layer 130 may be etched.

Figure 12A:
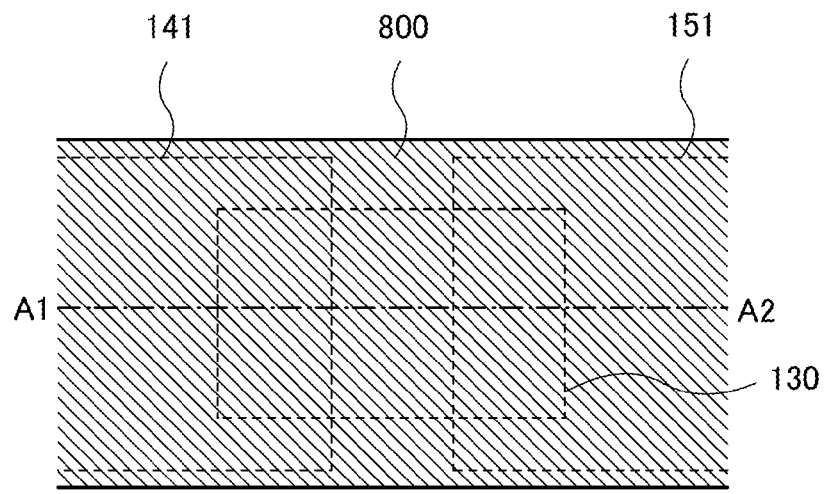
FIGS. 12A and 12B illustrate a method for fabricating a transistor.

Note that in the case of forming a transistor whose channel length (a distance between the second source electrode layer 142 and the second drain electrode layer 152) is extremely short, the second conductive film 800 is etched first so as to cover the first source electrode layer 141 and the first drain electrode layer 151, as illustrated in a top view in FIG. 12A. Note that the second conductive film 800 is formed so as to overlap with at least the first source electrode layer 141 and the first drain electrode layer 151 in the vicinity of the oxide semiconductor layer 130.

Figure 12B:
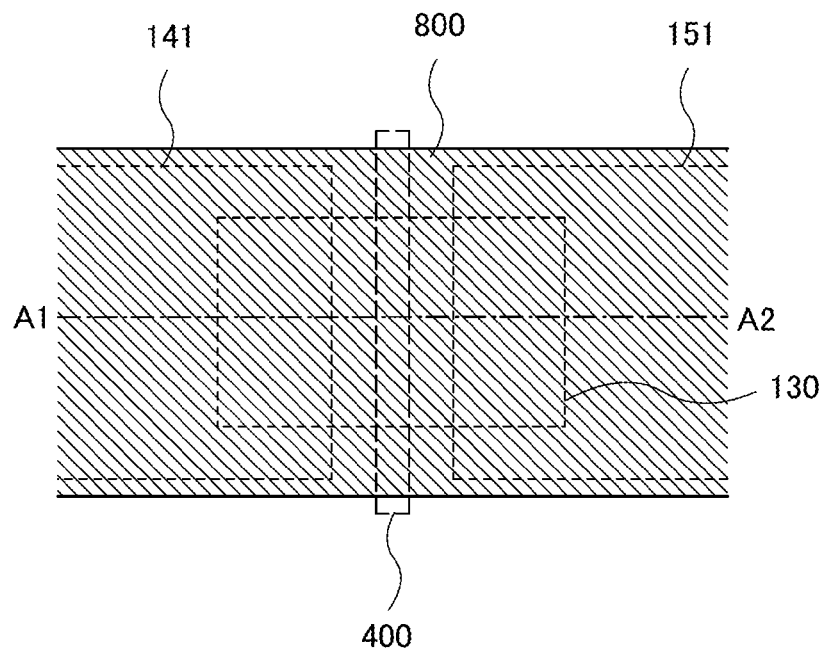

Then, a region 400 for dividing the second conductive film 800, which is illustrated in FIG. 12B is etched using a resist mask that is processed by a method suitable for fine line processing, such as electron beam exposure; accordingly, the second source electrode layer 142 and the second drain electrode layer 152 are formed. Note that by the use of a positive type resist for the resist mask, the exposed region can be minimized and throughput can be thus improved. In the above manner, a transistor having a channel length of 30 nm or less can be formed.

Next, second heat treatment is preferably performed. The second heat treatment can be performed under a condition similar to that of the first heat treatment. By the second heat treatment, impurities such as hydrogen and water can be further removed from the oxide semiconductor layer 130.

Figure 11A:
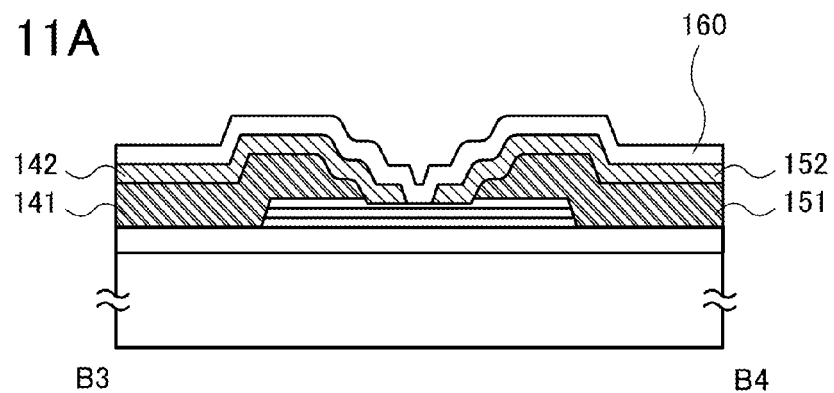
FIGS. 11A to 11C illustrate a method for fabricating a transistor.

Next, the gate insulating film 160 is formed over the oxide semiconductor layer 130, the second source electrode layer 142, and the second drain electrode layer 152 (see FIG. 11A). The gate insulating film 160 can be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like. The gate insulating film 160 may be a stack of any of the above materials. The gate insulating film 160 can be formed by a sputtering method, a CVD method, an MBE method, an MOCVD method, an ALD method, a PLD method, or the like.

Figure 11B:
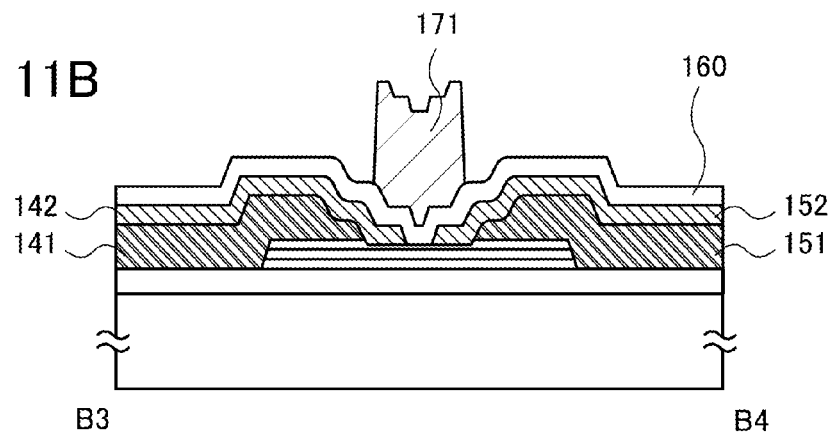

After that, a third conductive film to be the first gate electrode layer 171, the second gate electrode layer 172, and the third gate electrode layer 173 is formed over the gate insulating film 160. For the third conductive film, Al, Ti, Cr, Co, Ni, Cu, Y, Zr, Mo, Ru, Ag, Ta, W, or an alloy material containing any of these as its main component can be used. The third conductive film can be formed by a sputtering method, an MBE method, an MOCVD method, an ALD method, a PLD method or the like. The third conductive film is etched so that the first gate electrode layer 171, the second gate electrode layer 172, and the third gate electrode layer 173 are formed to overlap with the channel formation region and to be separated from one another (see FIG. 11B). Note that the second gate electrode layer 172 and the third gate electrode layer 173 are not illustrated in FIG. 11B.

Figure 11C:
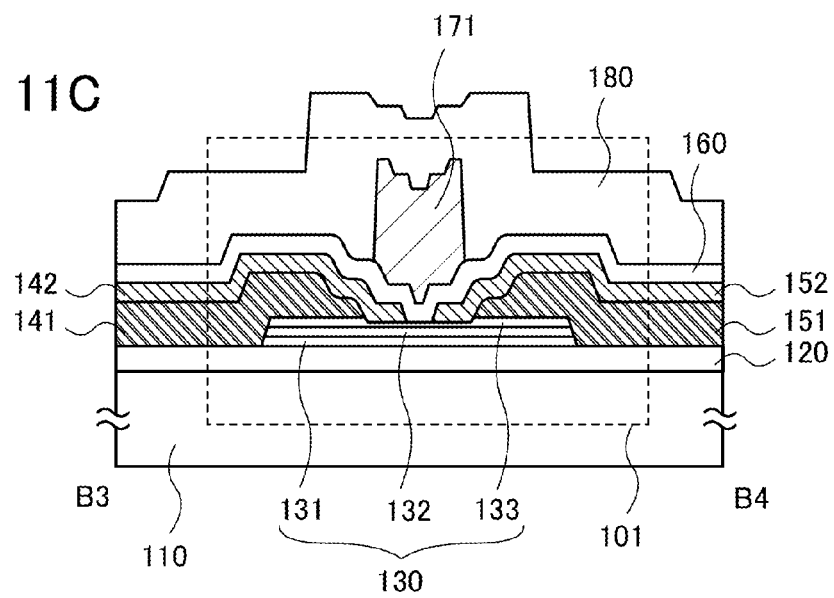

Next, the oxide insulating layer 180 is formed over the gate insulating film 160, the first gate electrode layer 171, the second gate electrode layer 172, and the third gate electrode layer 173 (see FIG. 11C). The oxide insulating layer 180 can be formed using a material and a method which are similar to those of the base insulating film 120. The oxide insulating layer 180 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or an oxide insulating layer containing nitrogen. The oxide insulating layer 180 can be formed by a sputtering method, a CVD method, an MBE method, an MOCVD method, an ALD method, or a PLD method, and is preferably formed to contain excess oxygen so as to be able to supply oxygen to the oxide semiconductor layer 130.

Oxygen may be added to the oxide insulating layer 180 by an ion implantation method, an ion doping method, a plasma immersion ion implantation method, or the like. By addition of oxygen, the oxide insulating layer 180 can supply oxygen much easily to the oxide semiconductor layer 130.

Next, third heat treatment is preferably performed. The third heat treatment can be performed under a condition similar to that of the first heat treatment. By the third heat treatment, excess oxygen is easily released from the base insulating film 120, the gate insulating film 160, and the oxide insulating layer 180, so that oxygen vacancies in the oxide semiconductor layer 130 can be reduced.

Through the above process, the transistor 101 illustrated in FIGS. 7A to 7C can be fabricated.

This embodiment can be combined as appropriate with any of the other embodiments in this specification.

Embodiment 5

In this embodiment, an example of a semiconductor device (memory device) which includes a transistor of one embodiment of the present invention, which can retain stored data even when not powered, and which has an unlimited number of write cycles will be described with reference to drawings.

Figure 13A:
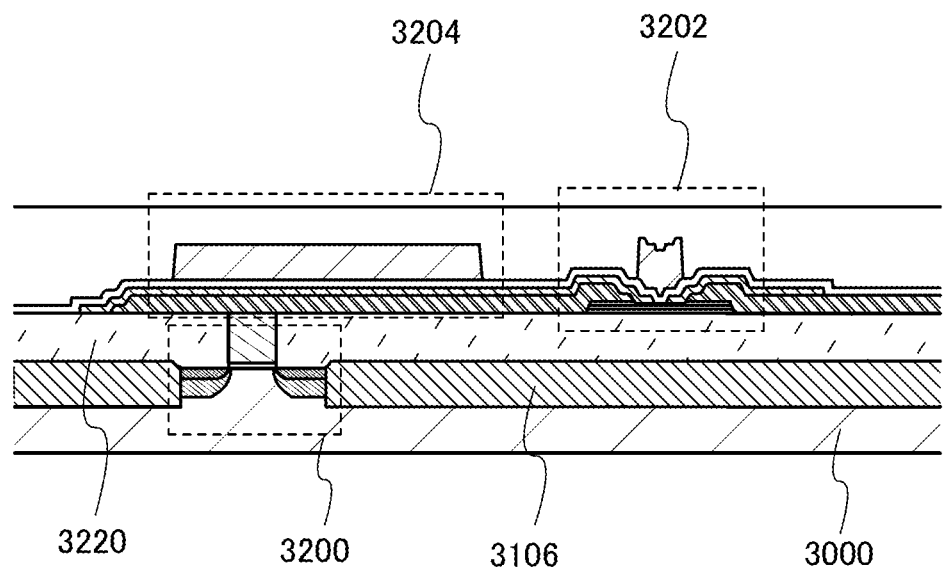
FIG. 13A is a cross-sectional view of a semiconductor device.
Figure 13B:
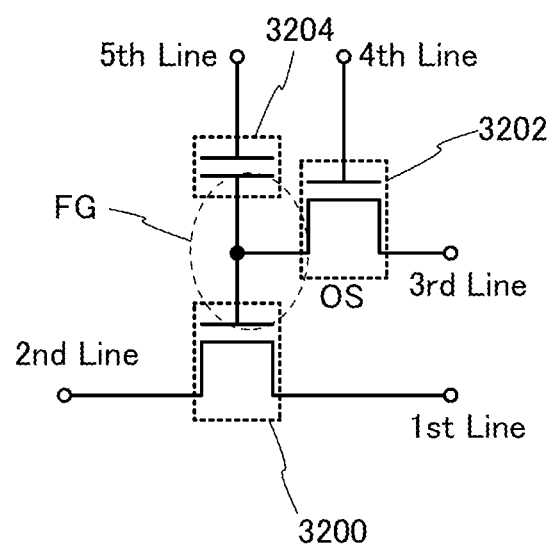
FIG. 13B is a circuit diagram thereof.

FIG. 13A is a cross-sectional view of the semiconductor device, and FIG. 13B is a circuit diagram of the semiconductor device.

The semiconductor device illustrated in FIGS. 13A and 13B includes a transistor 3200 including a first semiconductor material in a lower portion, and a transistor 3202 including a second semiconductor material and a capacitor 3204 in an upper portion. As the transistor 3202, any of the transistors described in Embodiments 1 to 3 can be used, and an example in which the transistor 101 described in Embodiment 1 with reference to FIGS. 7A to 7C is applied to the transistor 3202 is described in this embodiment. One electrode of the capacitor 3204 is formed using the same material as a gate electrode layer of the transistor 3202, the other electrode of the capacitor 3204 is formed using the same material as a source electrode layer and a drain electrode layer of the transistor 3202, and a dielectric of the capacitor 3204 is formed using the same material as the gate insulating film 160 of the transistor 3202; thus, the capacitor 3204 can be formed at the same time as the transistor 3202.

Here, the first semiconductor material and the second semiconductor material are preferably materials having different band gaps. For example, the first semiconductor material may be a semiconductor material (such as silicon) other than an oxide semiconductor, and the second semiconductor material may be the oxide semiconductor described in Embodiment 1. A transistor including a material other than an oxide semiconductor can operate at high speed easily. On the other hand, a transistor including an oxide semiconductor enables charge to be held for a long time owing to its electrical characteristics, that is, the low off-state current.

Although both of the above transistors are n-channel transistors in the following description, it is needless to say that p-channel transistors can be used. The specific structure of the semiconductor device, such as the material used for the semiconductor device and the structure of the semiconductor device, is not necessarily limited to that described here except for the use of the transistor described in Embodiments 1 to 3, which is formed using an oxide semiconductor for storing data.

The transistor 3200 in FIG. 13A includes a channel formation region provided in a substrate 3000 including a semiconductor material (such as crystalline silicon), impurity regions provided such that the channel formation region is provided therebetween, intermetallic compound regions provided in contact with the impurity regions, a gate insulating film provided over the channel formation region, and a gate electrode layer provided over the gate insulating film. Note that a transistor whose source electrode layer and drain electrode layer are not illustrated in a drawing may also be referred to as a transistor for the sake of convenience. Further, in such a case, in description of a connection of a transistor, a source region and a source electrode layer may be collectively referred to as a source electrode layer, and a drain region and a drain electrode layer may be collectively referred to as a drain electrode layer. That is, in this specification, the term "source electrode layer" might include a source region.

Further, an element isolation insulating layer 3106 is formed on the substrate 3000 so as to surround the transistor 3200, and an insulating layer 3220 is formed so as to cover the transistor 3200. Note that the element isolation insulating layer 3106 can be formed by an element isolation technique such as local oxidation of silicon (LOCOS) or shallow trench isolation (STI).

For example, the transistor 3200 formed using a crystalline silicon substrate can operate at high speed. Thus, when the transistor is used as a reading transistor, data can be read at high speed. As treatment prior to formation of the transistor 3202 and the capacitor 3204, CMP treatment is performed on the insulating layer 3220 covering the transistor 3200, whereby the insulating layer 3220 is planarized and, at the same time, an upper surface of the gate electrode layer of the transistor 3200 is exposed.

The transistor 3202 is provided over the insulating layer 3220, and one of the source electrode layer and the drain electrode layer thereof is extended so as to function as the other electrode of the capacitor 3204.

The transistor 3202 in FIG. 13A is a top-gate transistor in which a channel is formed in an oxide semiconductor layer. Since the off-state current of the transistor 3202 is low, stored data can be retained for a long period owing to such a transistor. In other words, refresh operation becomes unnecessary or the frequency of the refresh operation in a semiconductor memory device can be extremely low, which leads to a sufficient reduction in power consumption.

Although not illustrated in FIG. 13A, the transistor 3202 includes, in the depth direction of FIG. 13A, a second gate electrode layer and a third gate electrode layer which cover end portions of the oxide semiconductor layer with the gate insulating film provided therebetween. The threshold voltage of the transistor 3202 can be controlled by supply of an appropriate potential to the second gate electrode layer and the third gate electrode layer. In addition, long-term reliability of the transistor 3202 can be improved.

The transistor 3200 and the transistor 3202 can be formed so as to overlap with each other as illustrated in FIG. 13A, whereby the area occupied by them can be reduced. Accordingly, the degree of integration of the semiconductor device can be increased.

An example of a circuit configuration corresponding to FIG. 13A is illustrated in FIG. 13B.

In FIG. 13B, a first wiring (1st Line) is electrically connected to a source electrode layer of the transistor 3200. A second wiring (2nd Line) is electrically connected to a drain electrode layer of the transistor 3200. A third wiring (3rd Line) is electrically connected to the other of the source electrode layer and the drain electrode layer of the transistor 3202, and a fourth wiring (4th Line) is electrically connected to the gate electrode layer of the transistor 3202. The gate electrode layer of the transistor 3200 and the one of the source electrode layer and the drain electrode layer of the transistor 3202 are electrically connected to the other electrode of the capacitor 3204. A fifth wiring (5th Line) is electrically connected to the one electrode of the capacitor 3204.

The semiconductor device in FIG. 13B utilizes a characteristic in which the potential of the gate electrode layer of the transistor 3200 can be held, and thus enables writing, storing, and reading of data as follows.

Writing and storing of data are described. First, the potential of the fourth wiring is set to a potential at which the transistor 3202 is turned on, so that the transistor 3202 is turned on. Accordingly, the potential of the third wiring is supplied to the gate electrode layer of the transistor 3200 and the capacitor 3204. That is, a predetermined charge is supplied to the gate electrode layer of the transistor 3200 (writing). Here, one of two kinds of charges providing different potential levels (hereinafter referred to as a low-level charge and a high-level charge) is supplied. After that, the potential of the fourth wiring is set to a potential at which the transistor 3202 is turned off, so that the transistor 3202 is turned off. Thus, the charge supplied to the gate electrode layer of the transistor 3200 is held (holding).

Since the off-state current of the transistor 3202 is extremely low, the charge of the gate electrode layer of the transistor 3200 is held for a long time.

Next, reading of data is described. By supplying an appropriate potential (a reading potential) to the fifth wiring while supplying a predetermined potential (a constant potential) to the first wiring, the potential of the second wiring varies depending on the amount of charge held in the gate electrode layer of the transistor 3200. This is because in general, when the transistor 3200 is an n-channel transistor, an apparent threshold voltage $V_{th\_H}$ in the case where the high-level charge is given to the gate electrode layer of the transistor 3200 is lower than an apparent threshold voltage $V_{th\_L}$ in the case where the low-level charge is given to the gate electrode layer of the transistor 3200. Here, an apparent threshold voltage refers to the potential of the fifth wiring which is needed to turn on the transistor 3200. Thus, the potential of the fifth wiring is set to a potential $V_0$ which is between $V_{th\_H}$ and $V_{th\_L}$, whereby charge supplied to the gate electrode layer of the transistor 3200 can be determined. For example, in the case where the high-level charge is supplied in writing, when the potential of the fifth wiring is $V_0$ ($>V_{th\_H}$), the transistor 3200 is turned on. In the case where the low-level charge is supplied in writing, even when the potential of the fifth wiring is $V_0$ ($<V_{th\_L}$), the transistor 3200 remains off. Therefore, the data stored in the gate electrode layer can be read by determining the potential of the second wiring.

Note that in the case where memory cells are arrayed, it is necessary that only data of a desired memory cell be able to be read. The fifth wiring in the case where data is not read may be supplied with a potential at which the transistor 3200 is turned off regardless of the state of the gate electrode layer, that is, a potential lower than $V_{th\_H}$. Alternatively, the fifth wiring may be supplied with a potential at which the transistor 3200 is turned on regardless of the state of the gate electrode layer, that is, a potential higher than $V_{th\_L}$.

When including a transistor having a channel formation region formed using an oxide semiconductor and having an extremely low off-state current, the semiconductor device described in this embodiment can retain stored data for an extremely long period. In other words, refresh operation becomes unnecessary or the frequency of the refresh operation can be extremely low, which leads to a sufficient reduction in power consumption. Moreover, stored data can be retained for a long period even when power is not supplied (note that a potential is preferably fixed).

Further, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating film does not arise at all. That is, the semiconductor device according to the disclosed invention does not have a limitation on the number of times data can be rewritten, which is a problem of a conventional nonvolatile memory, and the reliability thereof is drastically improved. Furthermore, data is written depending on the on state and the off state of the transistor, whereby high-speed operation can be easily achieved.

As described above, a miniaturized and highly-integrated semiconductor device having high electrical characteristics and a fabrication method of the semiconductor device can be provided.

This embodiment can be combined as appropriate with any of the other embodiments in this specification.

Embodiment 6

In this embodiment, a semiconductor device including a transistor of one embodiment of the present invention, which can retain stored data even when not powered, which does not have a limitation on the number of write cycles, and which has a structure different from that described in Embodiment 5, will be described.

Figure 14A:
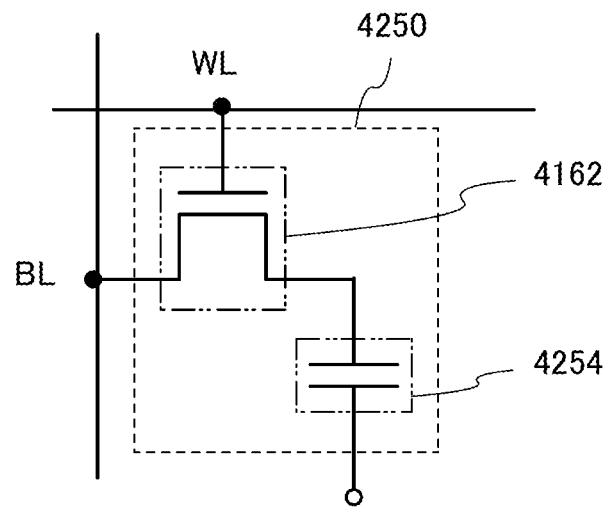
FIG. 14A is a circuit diagram of a semiconductor device.
Figure 14B:
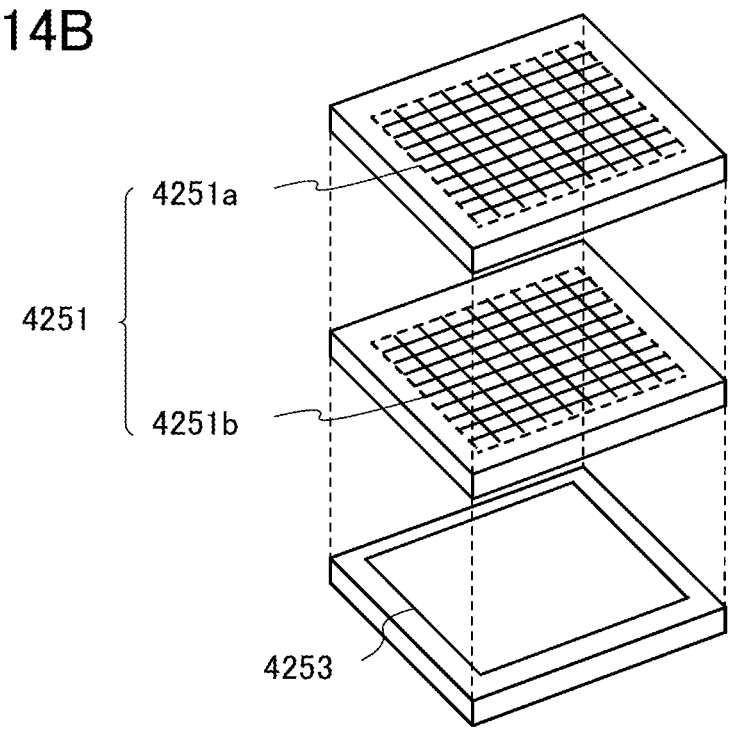
FIG. 14B is a perspective view thereof.

FIG. 14A illustrates an example of a circuit configuration of the semiconductor device, and FIG. 14B is a conceptual diagram illustrating an example of the semiconductor device. As a transistor 4162 included in the semiconductor device, any of the transistors described in Embodiments 1 to 3 can be used. A capacitor 4254 can be formed through the same process and at the same time as the transistor 4162 in a manner similar to that of the capacitor 3204 described in Embodiment 5.

In the semiconductor device illustrated in FIG. 14A, a bit line BL is electrically connected to a source electrode layer of the transistor 4162, a word line WL is electrically connected to a gate electrode layer of the transistor 4162, and a drain electrode layer of the transistor 4162 is electrically connected to a first terminal of the capacitor 4254.

Next, writing and storing of data in the semiconductor device (a memory cell 4250) illustrated in FIG. 14A are described.

First, the potential of the word line WL is set to a potential at which the transistor 4162 is turned on, and the transistor 4162 is turned on. Accordingly, the potential of the bit line BL is supplied to the first terminal of the capacitor 4254 (writing). After that, the potential of the word line WL is set to a potential at which the transistor 4162 is turned off, so that the transistor 4162 is turned off. Thus, the potential of the first terminal of the capacitor 4254 is held (holding).

In addition, the transistor 4162 including an oxide semiconductor has an extremely low off-state current. For that reason, the potential of the first terminal of the capacitor 4254 (or a charge accumulated in the capacitor 4254) can be held for an extremely long time by turning off the transistor 4162.

Next, reading of data is described. When the transistor 4162 is turned on, the bit line BL which is in a floating state and the capacitor 4254 are electrically connected to each other, and the charge is redistributed between the bit line BL and the capacitor 4254. As a result, the potential of the bit line BL is changed. The amount of change in potential of the bit line BL varies depending on the potential of the first terminal of the capacitor 4254 (or the charge accumulated in the capacitor 4254).

For example, the potential of the bit line BL after charge redistribution is $(C_B \times V_{B0} + C \times V)/(C_B + C)$, where V is the potential of the first terminal of the capacitor 4254, C is the capacitance of the capacitor 4254, $C_B$ is the capacitance component of the bit line BL (hereinafter also referred to as bit line capacitance), and $V_{B0}$ is the potential of the bit line BL before the charge redistribution. Therefore, it can be found that assuming that the memory cell 4250 is in either of two states in which the potentials of the first terminal of the capacitor 4254 are $V_1$ and $V_0$ ($V_1 > V_0$), the potential of the bit line BL in the case of holding the potential $V_1$ ($=(C_B \times V_{B0} + C \times V_1)/(C_B + C)$) is higher than the potential of the bit line BL in the case of holding the potential $V_0$ ($=(C_B \times V_{B0} + C \times V_0)/(C_B + C)$).

Then, by comparing the potential of the bit line BL with a predetermined potential, data can be read.

As described above, the semiconductor device illustrated in FIG. 14A can hold charge that is accumulated in the capacitor 4254 for a long time because the off-state current of the transistor 4162 is extremely low. In other words, refresh operation becomes unnecessary or the frequency of the refresh operation can be extremely low, which leads to a sufficient reduction in power consumption. Moreover, stored data can be retained for a long period even when power is not supplied.

Next, the semiconductor device illustrated in FIG. 14B is described.

The semiconductor device illustrated in FIG. 14B includes a memory cell array 4251 (memory cell arrays 4251a and 4251b) including the plurality of memory cells 4250 illustrated in FIG. 14A as memory circuits in the upper portion, and a peripheral circuit 4253 in the lower portion, which is necessary for operating the memory cell array 4251. Note that the peripheral circuit 4253 is electrically connected to the memory cell array 4251.

In the structure illustrated in FIG. 14B, the peripheral circuit 4253 can be provided under the memory cell array 4251. Thus, the size of the semiconductor device can be reduced.

It is preferable that a semiconductor material of the transistor provided in the peripheral circuit 4253 be different from that of the transistor 4162. For example, silicon, germanium, silicon germanium, silicon carbide, or gallium arsenide can be used, and a single crystal semiconductor is preferably used. Alternatively, an organic semiconductor material or the like may be used. A transistor including such a semiconductor material can operate at sufficiently high speed. Thus, the transistor enables a variety of circuits (e.g., a logic circuit and a driver circuit) which need to operate at high speed to be favorably obtained.

Note that FIG. 14B illustrates, as an example, the semiconductor device in which the memory cell array 4251 has a stack of the memory cell array 4251a and the memory cell array 4251b; however, the number of stacked memory cell arrays is not limited to two. For the memory cell array 4251, a stack of three or more memory cell arrays may be used, or only one memory cell array may be used.

The transistor 4162 is formed using an oxide semiconductor, and any of the transistors described in Embodiments 1 to 3 can be used as the transistor 4162. Since the off-state current of the transistor including an oxide semiconductor is low, stored data can be retained for a long period. In other words, the frequency of refresh operation can be extremely low, which leads to a sufficient reduction in power consumption.

A semiconductor device having a novel feature can be obtained by being provided with both a peripheral circuit which includes the transistor including a material other than an oxide semiconductor (in other words, a transistor capable of operating at sufficiently high speed) and a memory circuit which includes the transistor including an oxide semiconductor (in a broader sense, a transistor whose off-state current is sufficiently low). In addition, with a structure where the peripheral circuit and the memory circuit are stacked, an increase in the degree of integration of the semiconductor device can be achieved.

As described above, a miniaturized and highly-integrated semiconductor device having high electric characteristics can be provided.

This embodiment can be combined as appropriate with any of the other embodiments in this specification.

Embodiment 7

In this embodiment, examples of an electronic device and an electric device which can use any of the transistors described in Embodiments 1 to 4 will be described.

Any of the transistors described in Embodiments 1 to 3 can be applied to a variety of electronic devices (including game machines) and electric devices. Examples of the electronic devices include display devices of televisions, monitors, and the like, lighting devices, desktop personal computers and notebook personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, mobile phones, car phones, portable game machines, calculators, portable information terminals, electronic notebooks, e-book readers, electronic translators, audio input devices, cameras such as video cameras and digital still cameras, electric shavers, and IC chips. Examples of the electric devices include high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, radiation counters, and medical equipment such as dialyzers. In addition, the examples of the electric devices include alarm devices such as smoke detectors, gas alarm devices, and security alarm devices. Further, the examples also include industrial equipment such as guide lights, traffic lights, belt conveyors, elevators, escalators, industrial robots, and power storage systems. In addition, moving objects and the like driven by oil engines and electric motors using power from non-aqueous secondary batteries are also included in the category of electric devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, and spacecrafts. Specific examples of these electronic devices and electric devices are illustrated in FIG. 15, FIG. 16, FIGS. 17A to 17C, and FIGS. 18A to 18C.

First, as an example of the alarm device, a structure of a fire alarm is described. A fire alarm in this specification refers to any device which raises an alarm over fire occurrence instantly, and for example, a residential fire alarm, an automatic fire alarm system, and a fire detector used for the automatic fire alarm system are included in its category.

Figure 15:
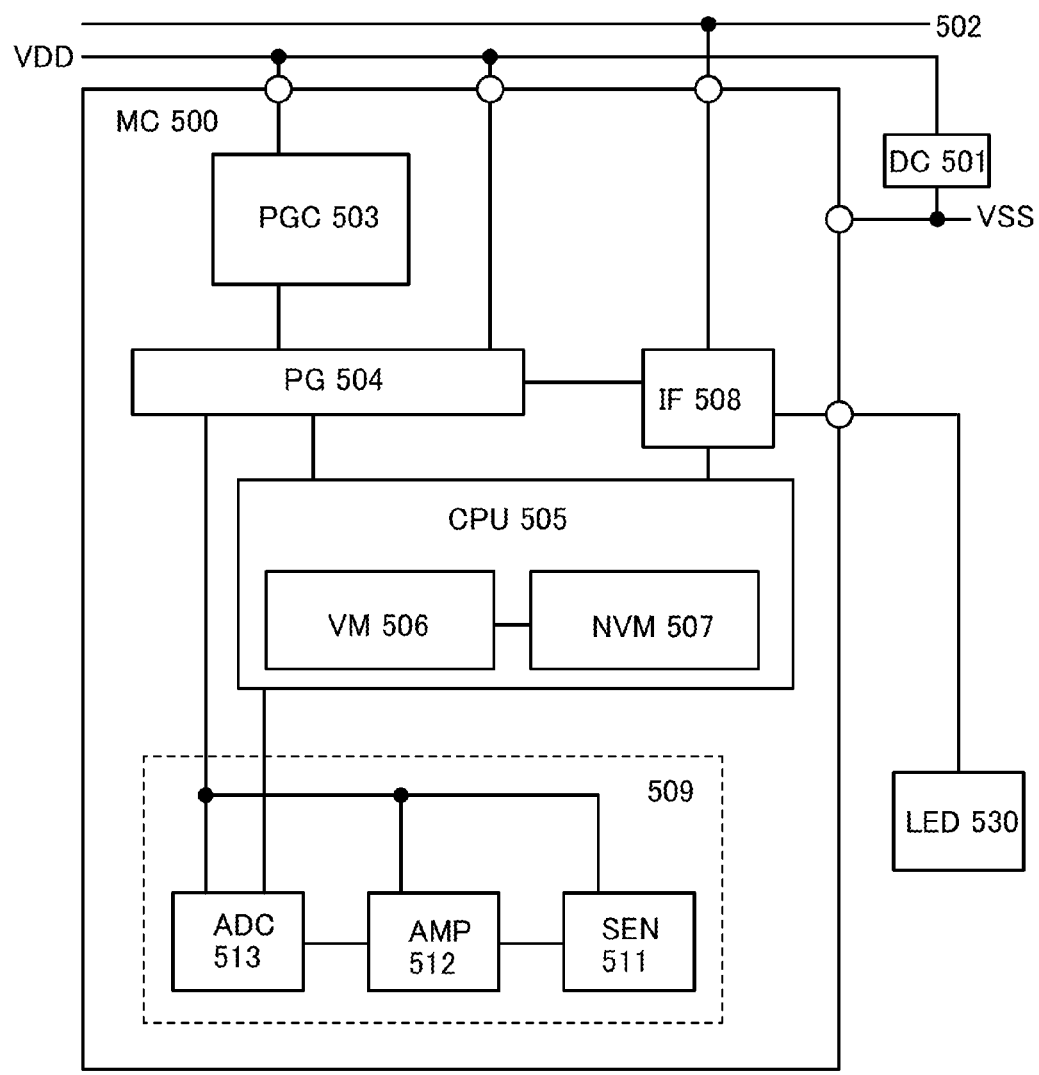
FIG. 15 is a block diagram of a semiconductor device.

An alarm device illustrated in FIG. 15 includes at least a microcomputer 500. Here, the microcomputer 500 is provided in the alarm device. The microcomputer 500 includes a power gate controller 503 electrically connected to a high potential power supply line VDD, a power gate 504 electrically connected to the high potential power supply line VDD and the power gate controller 503, a CPU (central processing unit) 505 electrically connected to the power gate 504, and a sensor portion 509 electrically connected to the power gate 504 and the CPU 505. Further, the CPU 505 includes a volatile memory portion 506 and a nonvolatile memory portion 507.

The CPU 505 is electrically connected to a bus line 502 through an interface 508. The interface 508 as well as the CPU 505 is electrically connected to the power gate 504. As a bus standard of the interface 508, an I$^2$C bus can be used, for example. A light-emitting element 530 electrically connected to the power gate 504 through the interface 508 is provided in the alarm device described in this embodiment.

The light-emitting element 530 is preferably an element which emits light with high directivity, and for example, an organic EL element, an inorganic EL element, or a light-emitting diode (LED) can be used.

The power gate controller 503 includes a timer and controls the power gate 504 with the use of the timer. The power gate 504 allows or stops supply of power from the high potential power supply line VDD to the CPU 505, the sensor portion 509, and the interface 508, in accordance with the control by the power gate controller 503. Here, as an example of the power gate 504, a switching element such as a transistor can be given.

With the use of the power gate controller 503 and the power gate 504, power is supplied to the sensor portion 509, the CPU 505, and the interface 508 in a period during which the amount of light is measured, and supply of power to the sensor portion 509, the CPU 505, and the interface 508 can be stopped during an interval between measurement periods. The alarm device operates in such a manner, whereby a reduction in power consumption of the alarm device can be achieved compared with that of the case where power is continuously supplied to the above structures.

In the case where a transistor is used as the power gate 504, it is preferable to use a transistor which has an extremely low off-state current and is used for the nonvolatile memory portion 507, for example, a transistor including an oxide semiconductor. With the use of such a transistor, a leakage current can be reduced when supply of power is stopped by the power gate 504, so that a reduction in power consumption of the alarm device can be achieved.

A direct-current power source 501 may be provided in the alarm device described in this embodiment so that power is supplied from the direct-current power source 501 to the high potential power supply line VDD. An electrode of the direct-current power source 501 on a high potential side is electrically connected to the high potential power supply line VDD, and an electrode of the direct-current power source 501 on a low potential side is electrically connected to a low potential power supply line VSS. The low potential power supply line VSS is electrically connected to the microcomputer 500. Here, the high potential power supply line VDD is supplied with a high potential H. The low potential power supply line VSS is supplied with a low potential L, for example, a ground potential (GND).

In the case where a battery is used as the direct-current power source 501, for example, a battery case including an electrode electrically connected to the high potential power supply line VDD, an electrode electrically connected to the low potential power supply line VSS, and a housing which can hold the battery is provided in a housing. Note that the alarm device described in this embodiment does not necessarily include the direct-current power source 501 and may have, for example, a structure in which power is supplied from an alternate-current power source provided outside the alarm device through a wiring.

As the above battery, a secondary battery such as a lithium ion secondary battery (also called a lithium ion storage battery or a lithium ion battery) can be used. Further, a solar battery is preferably provided so that the secondary battery can be charged.

The sensor portion 509 measures a physical quantity relating to an abnormal situation and transmits a measurement value to the CPU 505. A physical quantity relating to an abnormal situation depends on the usage of the alarm device, and in an alarm device functioning as a fire alarm, a physical quantity relating to a fire is measured. Accordingly, the sensor portion 509 measures the amount of light as a physical quantity relating to a fire and senses smoke.

The sensor portion 509 includes an optical sensor 511 electrically connected to the power gate 504, an amplifier 512 electrically connected to the power gate 504, and an AD converter 513 electrically connected to the power gate 504 and the CPU 505. The optical sensor 511, the amplifier 512, and the AD converter 513 which are provided in the sensor portion 509, and the light-emitting element 530 operate when the power gate 504 allows supply of power to the sensor portion 509.

Figure 16:
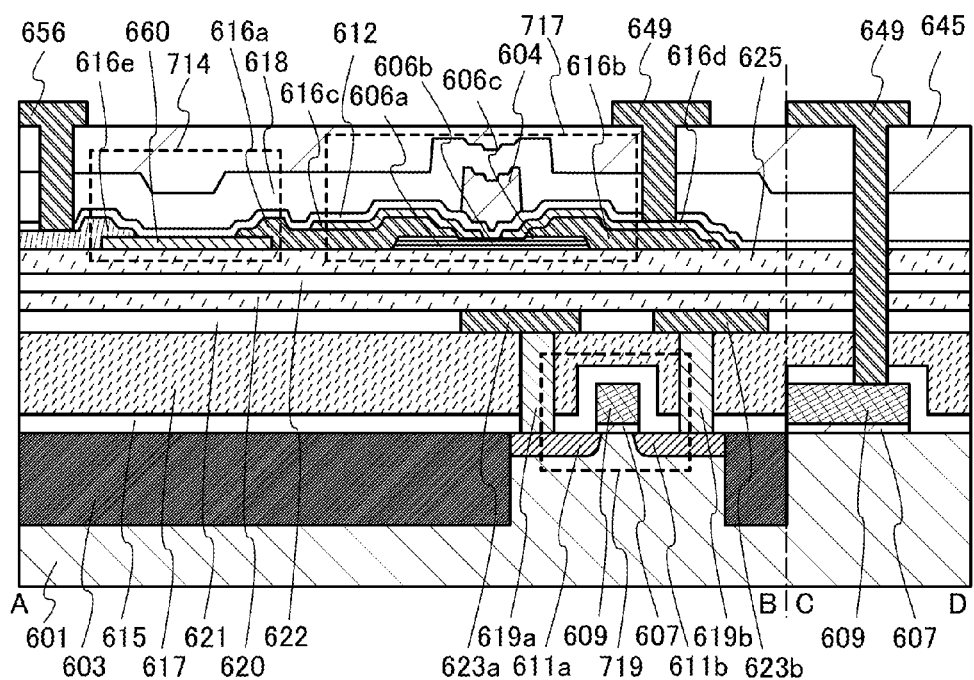
FIG. 16 is a cross-sectional view of a semiconductor device.

FIG. 16 illustrates part of the cross section of the alarm device. In the alarm device, element isolation regions 603 are formed in a p-type semiconductor substrate 601, and an n-channel transistor 719 including a gate insulating film 607, a gate electrode layer 609, n-type impurity regions 611a and 611b, an insulating film 615, and an insulating film 617 is formed. Here, the n-channel transistor 719 is formed using a semiconductor other than an oxide semiconductor, such as single crystal silicon, so that the n-channel transistor 719 can operate at sufficiently high speed. Accordingly, a volatile memory portion of a CPU that can achieve high-speed access can be formed.

In addition, contact plugs 619a and 619b are formed in openings which are formed by partly etching the insulating films 615 and 617, and an insulating film 621 having groove portions is formed over the insulating film 617 and the contact plugs 619a and 619b.

Wirings 623a and 623b are formed in the groove portions of the insulating film 621, and an insulating film 620 formed by a sputtering method, a CVD method, or the like is provided over the insulating film 621 and the wirings 623a and 623b. An insulating film 622 is formed over the insulating film 620.

An insulating film 625 formed by a sputtering method, a CVD method, or the like is provided over the insulating film 622, and a second transistor 717 and a photoelectric conversion element 714 are provided over the insulating film 625.

The second transistor 717 includes a first oxide semiconductor layer 606a, a second oxide semiconductor layer 606b, and a third oxide semiconductor layer 606c; a first source electrode layer 616a and a first drain electrode layer 616b in contact with the first oxide semiconductor layer 606a, the second oxide semiconductor layer 606b, and the third oxide semiconductor layer 606c; a second source electrode layer 616c and a second drain electrode layer 616d in contact with upper portions of the first source electrode layer 616a and the first drain electrode layer 616b, a gate insulating film 612, a gate electrode layer 604, and an oxide insulating layer 618. Moreover, an insulating film 645 cover the photoelectric conversion element 714 and the second transistor 717, and a wiring 649 is formed over the insulating film 645 so as to be in contact with the second drain electrode layer 616d. The wiring 649 functions as the node which electrically connects a drain electrode layer of the second transistor 717 to the gate electrode layer 609 of the n-channel transistor 719.

Here, any of the transistors described in Embodiments 1 to 3 can be used as the second transistor 717, and the first oxide semiconductor layer 606a, the second oxide semiconductor layer 606b, and the third oxide semiconductor layer 606c correspond to the first oxide semiconductor layer 131, the second oxide semiconductor layer 132, and the third oxide semiconductor layer 133 described in Embodiment 1, respectively. Moreover, the first source electrode layer 616a and the first drain electrode layer 616b correspond to the first source electrode layer 141 and the first drain electrode layer 151 described in Embodiment 1, respectively. The second source electrode layer 616c and the second drain electrode layer 616d correspond to the second source electrode layer 142 and the second drain electrode layer 152 described in Embodiment 1, respectively.

Although not illustrated in FIG. 16, the transistor 717 includes, in the depth direction of FIG. 16, a second gate electrode layer and a third gate electrode layer which cover end portions of the oxide semiconductor layers with the gate insulating film provided therebetween. The threshold voltage of the transistor 717 can be controlled by supply of an appropriate potential to the second gate electrode layer and the third gate electrode layer. In addition, long-term reliability of the transistor 717 can be improved.

The optical sensor 511 includes the photoelectric conversion element 714, a capacitor, a first transistor, the second transistor 717, a third transistor, and the n-channel transistor 719. As the photoelectric conversion element 714, a photodiode can be used here, for example.

One of terminals of the photoelectric conversion element 714 is electrically connected to the low potential power supply line VSS, and the other of the terminals thereof is electrically connected to one of the first source electrode layer 616a and the first drain electrode layer 616b and/or one of the second source electrode layer 616c and the second drain electrode layer 616d of the second transistor 717.

The gate electrode layer 604 of the second transistor 717 is supplied with an electric charge accumulation control signal Tx, and the other of the first source electrode layer 616a and the first drain electrode layer 616b and/or the other of the second source electrode layer 616c and the second drain electrode layer 616d of the second transistor 717 are/is electrically connected to one of a pair of electrodes of the capacitor, one of a source electrode layer and a drain electrode layer of the first transistor, and the gate electrode layer of the n-channel transistor 719 (hereinafter the node is referred to as a node FD in some cases).

The other of the pair of electrodes of the capacitor is electrically connected to the low potential power supply line VSS. A gate electrode layer of the first transistor is supplied with a reset signal Res, and the other of the source electrode layer and the drain electrode layer thereof is electrically connected to the high potential power supply line VDD.

One of a source electrode layer and a drain electrode layer of the n-channel transistor 719 is electrically connected to one of a source electrode layer and a drain electrode layer of the third transistor and the amplifier 512. The other of the source electrode layer and the drain electrode layer of the n-channel transistor 719 is electrically connected to the high potential power supply line VDD. A gate electrode layer of the third transistor is supplied with a bias signal Bias, and the other of the source electrode layer and the drain electrode layer thereof is electrically connected to the low potential power supply line VSS.

Note that the capacitor is not necessarily provided. For example, in the case where parasitic capacitance of the n-channel transistor 719 or the like is sufficiently large, a structure without the capacitor may be employed.

Further, as each of the first transistor and the second transistor 717, the transistor having an extremely low off-state current is preferably used. As the transistor having an extremely low off-state current, a transistor including an oxide semiconductor is preferably used. With such a structure, the potential of the node FD can be held for a long time.

In the structure in FIG. 16, the photoelectric conversion element 714 is electrically connected to the second transistor 717 and is provided over the insulating film 625.

The photoelectric conversion element 714 includes a semiconductor film 660 provided over the insulating film 625, and the first source electrode layer 616a and an electrode 616e which are in contact with a top surface of the semiconductor film 660. The first source electrode layer 616a is an electrode functioning as the source electrode layer or the drain electrode layer of the second transistor 717 and electrically connects the photoelectric conversion element 714 to the second transistor 717.

Over the semiconductor film 660, the first source electrode layer 616a, and the electrode 616e, the gate insulating film 612, the oxide insulating layer 618, and the insulating film 645 are provided. Further, a wiring 656 is formed over the insulating film 645 and is in contact with the electrode 616e through an opening provided in the gate insulating film 612, the oxide insulating layer 618, and the insulating film 645.

The electrode 616e can be formed in steps similar to those of the first source electrode layer 616a and the first drain electrode layer 616b, and the wiring 656 can be formed in steps similar to those of the wiring 649.

As the semiconductor film 660, a semiconductor film which can perform photoelectric conversion is provided, and for example, silicon or germanium can be used. In the case of using silicon, the semiconductor film 660 functions as an optical sensor which senses visible light. Further, there is a difference, between silicon and germanium, in wavelengths of electromagnetic waves that can be absorbed. When the semiconductor film 660 includes germanium, a sensor which mainly senses an infrared ray can be obtained.

In the above manner, the sensor portion 509 including the optical sensor 511 can be incorporated into the microcomputer 500, so that the number of components can be reduced and the size of the housing of the alarm device can be reduced. Note that in the case where the place of the optical sensor or the photoelectric conversion element needs a high degree of freedom, the optical sensor or the photoelectric conversion element may be externally provided so as to be electrically connected to the microcomputer 500.

In the alarm device including the above-described IC chip, the CPU 505 in which a plurality of circuits including any of the transistors described in the above embodiments are combined and mounted on one IC chip is used.

Figure 17A:
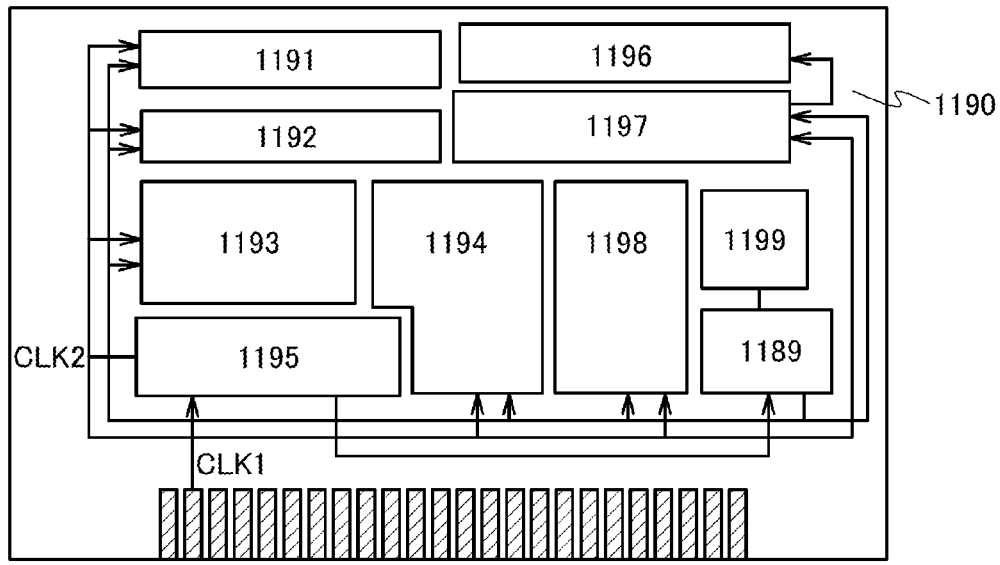
FIGS. 17A to 17C are block diagrams of a semiconductor device.
Figure 17B:
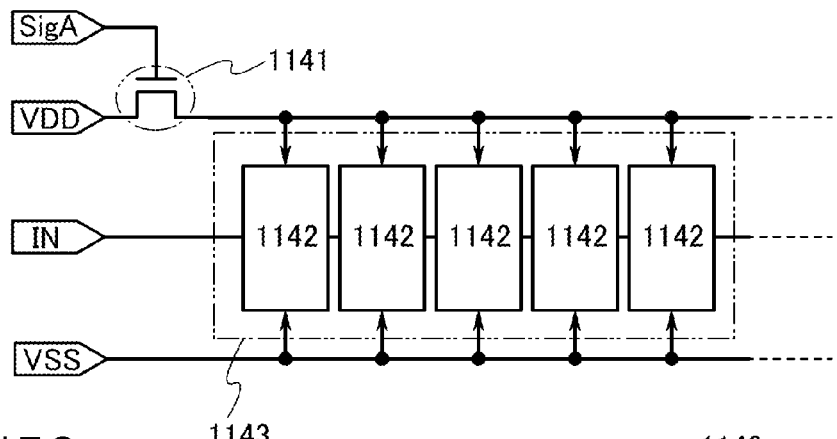
Figure 17C:
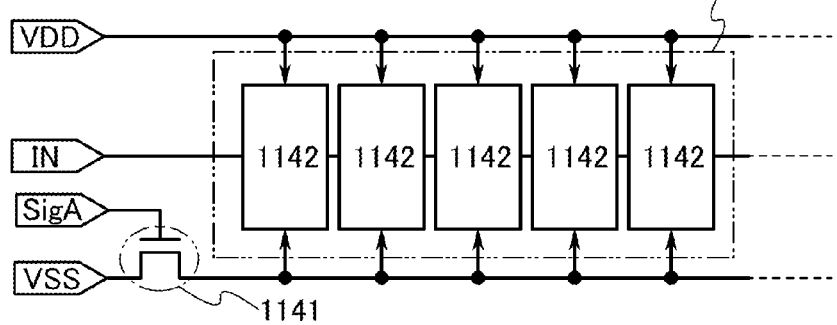

FIGS. 17A to 17C are block diagrams illustrating a specific configuration of a CPU at least partly including any of the transistors described in Embodiments 1 to 3.

The CPU illustrated in FIG. 17A includes an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and an ROM interface 1189 over a substrate 1190. A semiconductor substrate, an SOI substrate, a glass substrate, or the like is used as the substrate 1190. The ROM 1199 and the ROM interface 1189 may be provided over a separate chip. Needless to say, the CPU in FIG. 17A is just an example in which the configuration has been simplified, and an actual CPU may have various configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 17A, a memory cell is provided in the register 1196. As the memory cell of the register 1196, any of the transistors described in the above embodiments can be used.

In the CPU illustrated in FIG. 17A, the register controller 1197 selects operation of storing data in the register 1196 in accordance with an instruction from the ALU 1191. That is, the register controller 1197 selects whether data is stored by a flip-flop or by a capacitor in the memory cell included in the register 1196. When data storing by the flip-flop is selected, a power supply voltage is supplied to the memory cell in the register 1196. When data storing by the capacitor is selected, the data is rewritten in the capacitor, and supply of power supply voltage to the memory cell in the register 1196 can be stopped.

The power supply can be stopped by a switching element provided between a memory cell group and a node to which a power supply potential VDD or a power supply potential VSS is supplied, as illustrated in FIG. 17B or FIG. 17C. Circuits illustrated in FIGS. 17B and 17C are described below.

FIGS. 17B and 17C each illustrate an example of the configuration of a memory circuit in which any of the transistors described in the above embodiments is used as a switching element which controls supply of a power supply potential to a memory cell.

The memory device illustrated in FIG. 17B includes a switching element 1141 and a memory cell group 1143 including a plurality of memory cells 1142. Specifically, as each of the memory cells 1142, any of the transistors described in the above embodiments can be used. Each of the memory cells 1142 included in the memory cell group 1143 is supplied with the high-level power supply potential VDD via the switching element 1141. Further, each of the memory cells 1142 included in the memory cell group 1143 is supplied with a potential of a signal IN and the low-level power supply potential VSS.

In FIG. 17B, any of the transistors described in the above embodiments is used as the switching element 1141, and the switching of the transistor is controlled by a signal SigA supplied to a gate electrode layer thereof.

Note that FIG. 17B illustrates the configuration in which the switching element 1141 includes only one transistor; however, without particular limitation thereon, the switching element 1141 may include a plurality of transistors. In the case where the switching element 1141 includes a plurality of transistors which function as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 17B, the switching element 1141 may control the supply of the low-level power supply potential VSS.

In FIG. 17C, an example of a memory device in which each of the memory cells 1142 included in the memory cell group 1143 is supplied with the low-level power supply potential VSS via the switching element 1141 is illustrated. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be stored even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example here, the transistor can also be applied to an LSI such as a digital signal processor (DSP), a custom LSI, or a field programmable gate array (FPGA).

Figure 18A:
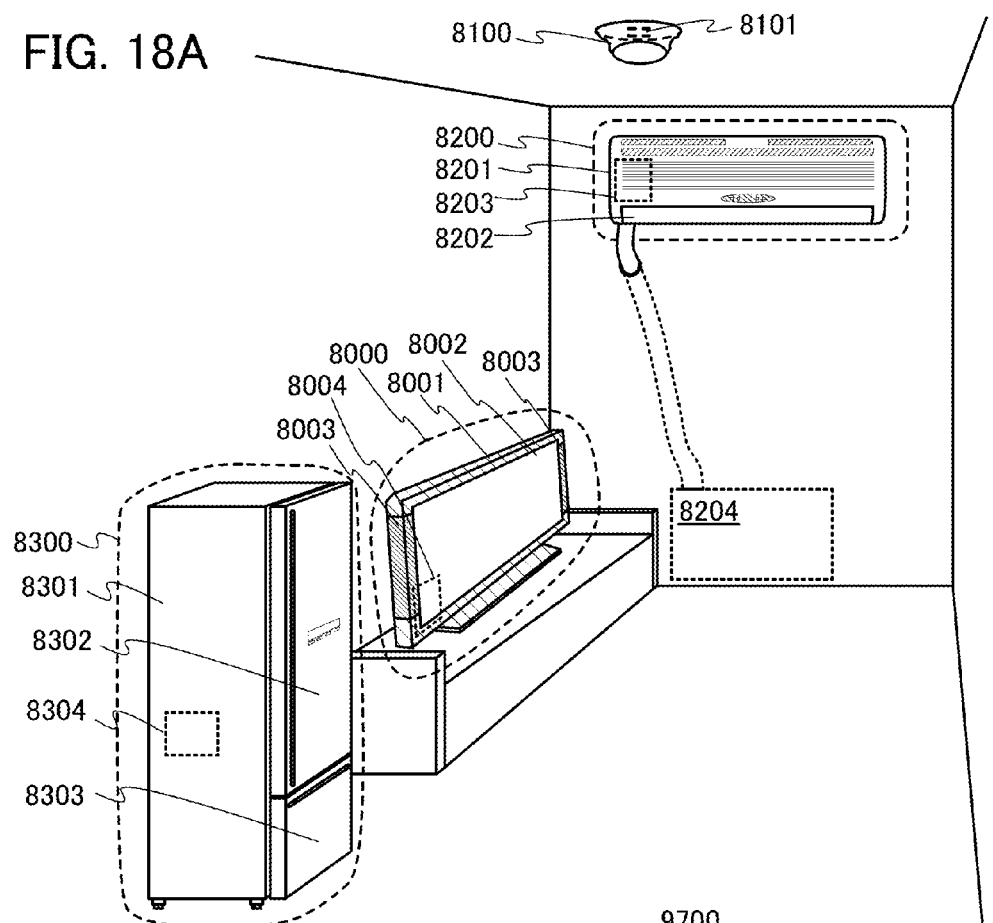
FIGS. 18A to 18C illustrate electronic devices and electric devices to which semiconductor devices can be applied.

In FIG. 18A, an alarm device 8100 is a residential fire alarm, which is an example of an electric device including a sensor portion and a microcomputer 8101. Note that the microcomputer 8101 is an example of an electronic device including a CPU in which any of the transistors described in the above embodiments is used.

In FIG. 18A, an air conditioner which includes an indoor unit 8200 and an outdoor unit 8204 is an example of an electric device including the CPU in which any of the transistors described in the above embodiments is used. Specifically, the indoor unit 8200 includes a housing 8201, an air outlet 8202, a CPU 8203, and the like. Although the CPU 8203 is provided in the indoor unit 8200 in FIG. 18A, the CPU 8203 may be provided in the outdoor unit 8204. Alternatively, the CPU 8203 may be provided in both the indoor unit 8200 and the outdoor unit 8204. By using any of the transistors described in the above embodiments for the CPU in the air conditioner, a reduction in power consumption of the air conditioner can be achieved.

In FIG. 18A, an electric refrigerator-freezer 8300 is an example of an electric device including the CPU in which any of the transistors described in the above embodiments is used. Specifically, the electric refrigerator-freezer 8300 includes a housing 8301, a door for a refrigerator 8302, a door for a freezer 8303, a CPU 8304, and the like. In FIG. 18A, the CPU 8304 is provided in the housing 8301. When any of the transistors described in the above embodiments is used as the CPU 8304 of the electric refrigerator-freezer 8300, a reduction in power consumption of the electric refrigerator-freezer 8300 can be achieved.

Figure 18B:
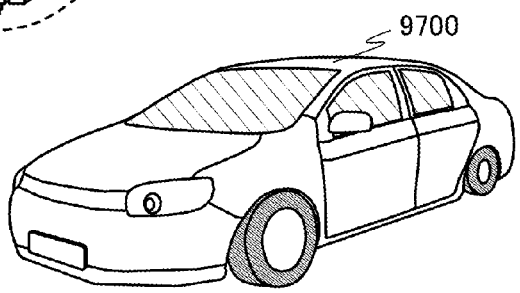
Figure 18C:
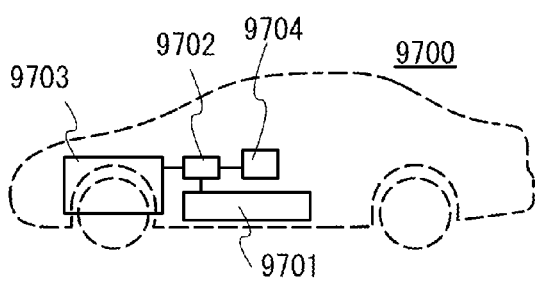

FIGS. 18B and 18C illustrate an example of an electric vehicle which is an example of an electric device. An electric vehicle 9700 is equipped with a secondary battery 9701. The output of the electric power of the secondary battery 9701 is adjusted by a control circuit 9702 and the electric power is supplied to a driving device 9703. The control circuit 9702 is controlled by a processing unit 9704 including a ROM, a RAM, a CPU, or the like which is not illustrated. When any of the transistors described in the above embodiments is used as the CPU in the electric vehicle 9700, a reduction in power consumption of the electric vehicle 9700 can be achieved.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts a direct current into an alternate current is also incorporated.

This embodiment can be combined as appropriate with any of the other embodiments in this specification.

REFERENCE NUMERALS

100: transistor, 101: transistor, 110: substrate, 120: base insulating film, 130: oxide semiconductor layer, 131: oxide semiconductor layer, 132: oxide semiconductor layer, 133: oxide semiconductor layer, 134: region, 140: source electrode layer, 141: source electrode layer, 142: source electrode layer, 150: drain electrode layer, 151: drain electrode layer, 152: drain electrode layer, 160: gate insulating film, 171: gate electrode layer, 172: gate electrode layer, 173: gate electrode layer, 180: oxide insulating layer, 200: transistor, 300: transistor, 400: region, 500: microcomputer, 501: direct-current power source, 502: bus line, 503: power gate controller, 504: power gate, 505: CPU, 506: volatile memory portion, 507: nonvolatile memory portion, 508: interface, 509: sensor portion, 511: optical sensor, 512: amplifier, 513: AD converter, 530: light-emitting element, 601: semiconductor substrate, 603: element isolation region, 604: gate electrode layer, 606a: oxide semiconductor layer, 606b: oxide semiconductor layer, 606c: oxide semiconductor layer, 607: gate insulating film, 609: gate electrode layer, 611a: impurity region, 611b: impurity region, 612: gate insulating film, 615: insulating film, 616a: source electrode layer, 616b: drain electrode layer, 616c: source electrode layer, 616d: drain electrode layer, 616e: electrode, 617: insulating film, 618: oxide insulating layer, 619a: contact plug, 619b: contact plug, 620: insulating film, 621: insulating film, 622: insulating film, 623a: wiring, 623b: wiring, 625: insulating film, 645: insulating film, 649: wiring, 656: wiring, 660: semiconductor film, 714: photoelectric conversion element, 717: transistor, 719: transistor, 800: conductive film, 1141: switching element, 1142: memory cell, 1143: memory cell group, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 3000: substrate, 3106: element isolation insulating layer, 3200: transistor, 3202: transistor, 3204: capacitor, 3220: insulating layer, 4162: transistor, 4250: memory cell, 4251: memory cell array, 4251a: memory cell array, 4251b: memory cell array, 4253: peripheral circuit, 4254: capacitor, 8100: alarm device, 8101: microcomputer, 8200: indoor unit, 8201: housing, 8202: air outlet, 8203: CPU, 8204: outdoor unit, 8300: electric refrigerator-freezer, 8301: housing, 8302: door for a refrigerator, 8303: door for a freezer, 8304: CPU, 9700: electric vehicle, 9701: secondary battery, 9702: control circuit, 9703: driving device, 9704: processing unit.

This application is based on Japanese Patent Application serial No. 2012-234359 filed with the Japan Patent Office on Oct. 24, 2012, the entire contents of which are hereby incorporated by reference.

The invention claimed is:

1. A semiconductor device comprising:
an oxide semiconductor layer over a substrate;
a source electrode and a drain electrode in contact with the oxide semiconductor layer;
a gate insulating film over the oxide semiconductor layer, the source electrode, and the drain electrode; and
a first gate electrode, a second gate electrode, and a third gate electrode over the gate insulating film,
wherein the first gate electrode, the second gate electrode, and the third gate electrode are separated from one another,
wherein the first gate electrode overlaps with the oxide semiconductor layer,
wherein the second gate electrode partly covers one end portion of the oxide semiconductor layer in a channel width direction, and
wherein the third gate electrode partly covers the other end portion of the oxide semiconductor layer in the channel width direction.

2. The semiconductor device according to claim 1, wherein the oxide semiconductor layer comprises a first oxide semiconductor layer, a second oxide semiconductor layer, and a third oxide semiconductor layer which are stacked in this order from the substrate.

3. The semiconductor device according to claim 2, wherein a bottom of a conduction band of each of the first oxide semiconductor layer and the third oxide semiconductor layer is closer to a vacuum level than a bottom of a conduction band of the second oxide semiconductor layer by 0.05 eV or more and 2 eV or less.

4. The semiconductor device according to claim 2,
wherein the first oxide semiconductor layer, the second oxide semiconductor layer, and the third oxide semiconductor layer are each an In-M-Zn oxide (M is Al, Ti, Ga, Y, Zr, La, Ce, Nd, or Hf), and
wherein an atomic ratio of M to In in each of the first oxide semiconductor layer and the third oxide semiconductor layer is higher than an atomic ratio of M to In in the second oxide semiconductor layer.

5. The semiconductor device according to claim 1,
the source electrode comprising:
a first source electrode layer in contact with the oxide semiconductor layer; and
a second source electrode layer covering the first source electrode layer and in contact with the oxide semiconductor layer, and
the drain electrode comprising:
a first drain electrode layer in contact with the oxide semiconductor layer; and
a second drain electrode layer covering the first drain electrode layer and in contact with the oxide semiconductor layer.

6. The semiconductor device according to claim 5,
wherein the first source electrode layer and the first drain electrode layer include a first material, and the second source electrode layer and the second drain electrode layer include a second material, and
wherein one of the first material and the second material is Al, Cr, Cu, Ta, Ti, Mo, W, or an alloy material containing any of them as its main component, and the other of the first material and the second material is tantalum nitride, titanium nitride, ruthenium, or an alloy material containing any of them as its main component.

7. The semiconductor device according to claim 5, wherein the first gate electrode overlaps with neither the first source electrode layer nor the first drain electrode layer.

8. A semiconductor device comprising:
a first oxide semiconductor layer over a substrate;
a second oxide semiconductor layer over the first oxide semiconductor layer;
a first source electrode layer and a first drain electrode layer in contact with the second oxide semiconductor layer;
a third oxide semiconductor layer over the second oxide semiconductor layer, the first source electrode layer, and the first drain electrode layer;
a second source electrode layer covering the first source electrode layer and in contact with the first source electrode layer and the third oxide semiconductor layer;
a second drain electrode layer covering the first drain electrode layer and in contact with the first drain electrode layer and the third oxide semiconductor layer;
a gate insulating film over the third oxide semiconductor layer, the second source electrode layer, and the second drain electrode layer; and
a first gate electrode, a second gate electrode, and a third gate electrode over the gate insulating film,
wherein the first gate electrode, the second gate electrode, and the third gate electrode are separated from one another,
wherein the first gate electrode overlaps with the first oxide semiconductor layer and the second oxide semiconductor layer, wherein the second gate electrode partly covers one end portion of each of the first oxide semiconductor layer and the second oxide semiconductor layer in a channel width direction, and wherein the third gate electrode partly covers the other end portion of each of the first oxide semiconductor layer and the second oxide semiconductor layer in the channel width direction.

9. The semiconductor device according to claim 8, wherein a bottom of a conduction band of each of the first oxide semiconductor layer and the third oxide semiconductor layer is closer to a vacuum level than a bottom of a conduction band of the second oxide semiconductor layer by 0.05 eV or more and 2 eV or less.

10. The semiconductor device according to claim 8, wherein the first oxide semiconductor layer, the second oxide semiconductor layer, and the third oxide semiconductor layer are each an In-M-Zn oxide (M is Al, Ti, Ga, Y, Zr, La, Ce, Nd, or Hf), and wherein an atomic ratio of M to In in each of the first oxide semiconductor layer and the third oxide semiconductor layer is higher than an atomic ratio of M to In in the second oxide semiconductor layer.

11. The semiconductor device according to claim 8, wherein the first source electrode layer and the first drain electrode layer include a first material, and the second source electrode layer and the second drain electrode layer include a second material, and wherein one of the first material and the second material is Al, Cr, Cu, Ta, Ti, Mo, W, or an alloy material containing any of them as its main component, and the other of the first material and the second material is tantalum nitride, titanium nitride, ruthenium, or an alloy material containing any of them as its main component.

12. The semiconductor device according to claim 8, wherein the first gate electrode overlaps with neither the first source electrode layer nor the first drain electrode layer.

* * * * *